United States Patent
Fjelstad et al.

(10) Patent No.: US 6,848,173 B2
(45) Date of Patent: Feb. 1, 2005

(54) MICROELECTRIC PACKAGES HAVING DEFORMED BONDED LEADS AND METHODS THEREFOR

(75) Inventors: Joseph Fjelstad, Maple Valley, WA (US); Masud Beroz, Livermore, CA (US); John W. Smith, Horseshoe Bay, TX (US); Belgacem Haba, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 197 days.

(21) Appl. No.: 09/766,814

(22) Filed: Jan. 22, 2001

(65) Prior Publication Data

US 2002/0068426 A1 Jun. 6, 2002

Related U.S. Application Data

(60) Continuation-in-part of application No. 09/520,320, filed on Mar. 7, 2000, now Pat. No. 6,846,003, which is a continuation of application No. 08/988,097, filed on Oct. 10, 1997, now abandoned, application No. 09/766,814, which is a continuation-in-part of application No. 09/271,688, filed on Mar. 18, 1999, now Pat. No. 6,429,112, which is a continuation-in-part of application No. 09/138,858, filed on Aug. 24, 1998, now Pat. No. 6,104,087, which is a division of application No. 08/440,665, filed on May 15, 1995, now Pat. No. 5,801,441, which is a division of application No. 08/271,768, filed on Jul. 7, 1994, now Pat. No. 5,518,964, said application No. 09/271,688, is a continuation-in-part of application No. 08/712,855, filed on Sep. 12, 1996, now Pat. No. 6,191,368, said application No. 09/271,688, is a continuation-in-part of application No. 09/057,125, filed on Apr. 8, 1998, now Pat. No. 5,959,354, which is a division of application No. 08/678,808, filed on Jul. 12, 1996, now Pat. No. 5,830,782.

(60) Provisional application No. 60/032,870, filed on Dec. 13, 1996, and provisional application No. 60/003,619, filed on Sep. 12, 1995.

(51) Int. Cl.$^7$ .......................... H05K 3/34; H01R 43/02

(52) U.S. Cl. .............................. 29/840; 29/843; 29/854; 29/860; 29/832; 438/107; 228/180.21; 228/180.5

(58) Field of Search ........................ 29/830, 832, 840, 29/842–843, 854–855, 857, 861, 841, 860; 438/107–109; 257/777–778, 783; 228/180.21, 180.5, 215; 156/307.3, 313, 275.5

(56) References Cited

U.S. PATENT DOCUMENTS

| 3,577,037 A | 5/1971 | Di Pietro .................... 317/101 |
| 3,811,186 A | 5/1974 | Larnerd et al. ............... 29/626 |
| 3,921,285 A | 11/1975 | Krall .......................... 29/626 |

(List continued on next page.)

FOREIGN PATENT DOCUMENTS

| JP | 2-20032 | * 1/1990 | .................. 29/841 |
| WO | WO 97/11588 | 3/1997 | |
| WO | WO 98/44564 | 10/1998 | |

OTHER PUBLICATIONS

IBM Technical Disclosure Bulletin, Backto, Back Pack, May 1, 1982, vol. 24, Issueе 12, p. 6371.*

Primary Examiner—A. Dexter Tugbang
(74) Attorney, Agent, or Firm—Lerner, David, Littenberg, Krumholz & Mentlik, LLP

(57) ABSTRACT

A method of making a microelectronic assembly includes juxtaposing a first element, such as a dielectric sheet having conductive leads thereon with a second element, such as a semiconductor chip, having contact thereon, and wire bonding the conductive leads on the first element to the contacts on the second element so that elongated bonding wires extend between the conductive leads and the contacts. After the wire bonding step, the first and second elements are moved through a pre-selected displacement relative to one another so as to deform the bonding wires. A flowable dielectric material may be introduced between the first and second elements and around the bonding wires during or after the moving step. The flowable material may be cured to form an encapsulant around at least a portion of the bonding wires.

22 Claims, 16 Drawing Sheets

U.S. PATENT DOCUMENTS

| | | | | |
|---|---|---|---|---|
| 4,535,219 A | | 8/1985 | Sliwa, Jr. | 219/121 |
| 4,545,610 A | | 10/1985 | Lakritz et al. | 29/589 |
| 4,764,848 A | | 8/1988 | Simpson | 439/71 |
| 4,878,611 A | | 11/1989 | LoVasco et al. | 228/180.2 |
| 4,893,172 A | | 1/1990 | Matsumoto et al. | 357/79 |
| 5,067,007 A | | 11/1991 | Otsuka et al. | 257/701 |
| 5,086,337 A | | 2/1992 | Noro et al. | 357/79 |
| 5,148,265 A | * | 9/1992 | Khandros | 357/80 |
| 5,148,266 A | | 9/1992 | Khandros et al. | 257/773 |
| 5,152,695 A | | 10/1992 | Grabbe et al. | 439/66 |
| 5,173,055 A | | 12/1992 | Grabbe | 439/66 |
| 5,189,507 A | | 2/1993 | Carlomagno et al. | 257/777 |
| 5,282,312 A | | 2/1994 | DiStefano et al. | 29/830 |
| 5,296,737 A | * | 3/1994 | Nishimura | 257/673 |
| 5,367,764 A | | 11/1994 | DiStefano et al. | 29/830 |
| 5,385,291 A | | 1/1995 | Latta | 228/180 |
| 5,390,844 A | | 2/1995 | Distefano et al. | 228/180.21 |
| 5,398,863 A | | 3/1995 | Grube et al. | 228/106 |
| 5,491,302 A | | 2/1996 | Distefano et al. | 174/260 |
| 5,518,964 A | | 5/1996 | DiStefano | |
| 5,536,909 A | | 7/1996 | DiStefano et al. | 174/261 |
| 5,587,341 A | | 12/1996 | Masayuki et al. | |
| 5,620,928 A | * | 4/1997 | Lee | 438/118 |
| 5,637,925 A | * | 6/1997 | Ludden | 257/774 |
| 5,659,952 A | * | 8/1997 | Kovac | 29/840 |
| 5,684,677 A | | 11/1997 | Uchida et al. | 361/770 |
| 5,726,500 A | | 3/1998 | Duboz et al. | 257/777 |
| 5,739,053 A | | 4/1998 | Kawakita et al. | 438/108 |
| 5,763,941 A | | 6/1998 | Fjelstad | 257/660 |
| 5,777,386 A | | 7/1998 | Higashi et al. | 257/737 |
| 5,794,330 A | | 8/1998 | Distefano et al. | 29/840 |
| 5,801,441 A | | 9/1998 | DiStefano | 257/696 |
| 5,830,782 A | | 11/1998 | Smith et al. | 438/123 |
| 5,859,472 A | | 1/1999 | DiStefano et al. | 257/674 |
| 5,898,223 A | | 4/1999 | Frye et al. | 257/777 |
| 6,016,013 A | | 1/2000 | Baba | 257/778 |
| 6,057,598 A | | 5/2000 | Payne et al. | 257/723 |

* cited by examiner

MICROELECTRIC PACKAGES HAVING DEFORMED BONDED LEADS AND METHODS THEREFOR

CROSS-REFERENCE TO RELATED APPLICATIONS

The present application is a continuation-in-part of commonly assigned U.S. patent application Ser. No. 09/520,320 filed Mar. 7, 2000 now U.S. Pat. No. 6,486,003, which in turn is a continuation of U.S. patent application Ser. No. 08/988,097 filed Oct. 10, 1997, now abandoned, which claims the benefit of U.S. Provisional Application 60/032,870 filed Dec., 13, 1996. The present application is also a continuation-in-part of U.S. patent application Ser. No. 09/271,688, filed Mar. 18, 1999 now U.S. Pat. No. 6,429,112, which in turn claims benefit of U.S. Provisional Application Ser. No. 60/032,870 filed Dec. 13, 1996. The Ser. No. 09/271,688 application is also a continuation-in-part of U.S. patent application Ser. No. 09/138,858 filed Aug. 24, 1998 now U.S. Pat. No. 6,104,087, which in turn is a divisional of U.S. patent application Ser. No. 08/440,665, filed May 15, 1995, now U.S. Pat. No. 5,801,441, which in turn is a divisional of U.S. patent application Ser. No. 08/271,768, filed Jul. 7, 1994, now U.S. Pat. No. 5,518,964. The Ser. No. 09/271,688 application is also a continuation-in-part of U.S. patent application Ser. No. 08/712,855, filed Sep. 12, 1996 now U.S. Pat. No. 6,191,368, which application claims benefit of U.S. Provisional Patent Application 60/003,619, filed Sep. 12, 1995. The Ser. No. 09/271,688 application is also a continuation-in-part of U.S. patent application Ser. No. 09/057,125, filed Apr. 8, 1998 now U.S. Pat. No. 5,959,354, which in turn is a divisional of U.S. patent application Ser. No. 08/678,808, filed Jul. 12, 1996, now U.S. Pat. No. 5,830,782. The disclosures of all of said applications and patents are hereby incorporated by reference herein.

BACKGROUND OF THE INVENTION

The present invention generally relates to microelectronic assemblies, and more specifically to components that facilitate connections between a microelectronic element such as a semiconductor chip, and an external circuit element such as a printed circuit board.

Connection components are typically used in combination with microelectronic elements such as semiconductor chips to facilitate electrical interconnections between semiconductor chips and external circuit elements. The reliability of the entire circuit typically depends upon the electrical connections between the chip, the connection component and the external circuit element.

Various attempts have been made to produce reliable connections between microelectronic elements such as semiconductor chips and external circuit elements. For example, certain preferred embodiments of commonly assigned U.S. Pat. No. 5,148,265, the disclosure of which is hereby incorporated by reference herein, disclose improved methods for connecting semiconductor chips to circuit elements. According to certain embodiments discussed in the '265 patent, a semiconductor chip is connected to a corresponding substrate through a connection component including a dielectric material. The semiconductor chip has a plurality of peripheral contacts positioned in a peripheral area of a front surface thereof and the connection component is formed with a plurality of connecting terminals, each of which is connected to a bonding terminal adjacent the periphery of the connection component. The connection component is supported by a compliant layer. The peripheral contacts of the semiconductor chip are connected to the terminals of the connection component by bonding a plurality of leads to the chip. In one embodiment, the lead-bonding operation uses wires which are bonded to bonding terminals on the periphery of the connection component and to the contacts of the chip. During a wire bonding operation, when downwardly directed forces are applied to the peripheral region of the connection component containing the bonding terminals, this peripheral regions flexes downwardly. In some instances, it has been determined that downward movement of the peripheral region of the connection component may impede the bonding of the wires and the bonding terminals.

Certain preferred embodiments of commonly assigned U.S. patent application Ser. No. 08/709,127, the disclosure of which is hereby incorporated by reference herein, disclose a structure for compliantly interconnecting semiconductor chips and supporting substrates while substantially obviating problems associated with thermal cycling. In one preferred embodiment, the semiconductor chip package includes a sheet-like substrate having one or more apertures extending from a first surface to a second surface of the substrate and conductive terminals which are contacted from the second surface of the substrate. The substrate further has conductive leads electrically connected to and extending from each terminal and across the one or more apertures. Each lead is connected to a bond pad on the opposite side of the aperture so that each lead has an expansion section within the aperture which is laterally curved with respect to the plane of the substrate. In certain preferred embodiments, the expansion sections laterally curve at least twice in opposite directions and in one particular embodiment create substantially "S" shaped lead portions. This structure allows the package to compensate for coefficient of thermal expansion ("CTE") mismatch problems by allowing flexing and bending of the expansion sections of the leads within the one or more apertures. The expansion sections of the leads are typically encapsulated with a compliant encapsulant to provided added support for their bending and flexing motion during thermal cycling.

Commonly assigned U.S. patent application Ser. No. 08/516,645, filed Aug. 18, 1995, the disclosure of which is hereby incorporated by reference herein, discloses a microelectronic assembly including a connection component having oppositely facing first and second surfaces, a connecting terminal region and a bonding terminal region. The connection component has connecting terminals on the second surface in the connecting terminal region and has bonding terminals in the bonding terminal region. The assembly also includes a microelectronic element such as a semiconductor chip or other element having a front surface and having contacts on the front surface. The connection component overlies the front surface of the semiconductor chip with the second surface of the connection component facing upwardly away from the chip and with the first surface facing downwardly toward the chip. The connecting terminals are movable relative to the chip in vertical directions, whereas the bonding terminals are supported against such vertical movement. The connection component preferably comprises a thin, flexible layer, and a compliant layer disposed between the flexible layer and the chip for movably supporting the connecting terminal region. The assembly according to this aspect of the invention desirably also includes a reinforcing structure for reinforcing the bonding terminal region of the flexible layer against vertical movement towards the semiconductor chip. Subassemblies according to this aspect of the invention can be subjected to a bonding operation, such as a wire bonding operation, in which flexible conductors such as bonding wires are connected between the bonding terminals and the contacts on the chip. Because the bonding terminal region is reinforced, the bonding operation can be conducted efficiently. However, the finished assembly still provides the benefits associated with a compliantly mounted interposer, including testability and compensation for thermal effects during operation.

In certain preferred embodiments of commonly assigned U.S. patent application Ser. No. 09/520,320 filed Mar. 7, 2000, the disclosure which is hereby incorporated by reference herein, disclosed a method of making a microelectronic package including an expandable structure. The method includes providing first and second microelectronic elements having electrically conductive parts, and providing an expandable structure between the microelectronic elements. The electrically conductive parts of the first and second microelectronic elements are then connected together so that they microelectronic elements are electrically interconnected. The expandable structure is then expanded after the connection step so that the microelectronic elements move away from one another. The expandable structure is substantially rigged before the expanding step and substantially compliant after the expanding step. During the expanding step, the expandable structure remains in contact with the microelectronic elements and the microelectronic elements remain electrically interconnected. Thus, the '320 patent application allows or provides a rigged structure during bonding of electrically conductive parts, whereby the rigged structure maybe transformed into a compliant structure after the bonding steps have been completed.

In spite of the improved methods described above for connecting a semiconductor chip and an external circuit element, further improvements would be desirable.

SUMMARY OF THE INVENTION

In accordance with certain preferred embodiments of the present invention, a method of making a microelectronic assembly includes juxtaposing a first microelectronic element having conductive leads thereon with a second microelectronic element having contacts thereon. In certain preferred embodiments, the first microelectronic element includes a dielectric substrate having top and bottom surfaces, the conductive leads being exposed to the top surface of the dielectric substrate, whereby the juxtaposing step includes juxtaposing the bottom surface of the dielectric substrate with the second microelectronic element. The dielectric element preferably has one or more apertures therein, the apertures being substantially aligned with the contacts of the second element during the juxtaposing step. The second element may include one or more semiconductor chips, or may include a plurality of semiconductor chips. The method also preferably includes the step of wire bonding the conductive leads on the first element to the contacts on the second element so that elongated bonding wires extend between the conductive leads and the contacts. The wire bonding step may include extending the bonding wires between the conductive leads and the contacts and through the one or more apertures in the dielectric substrate.

After the wire bonding step, the first and second elements are preferably moved through a pre-selected displacement relative to one another so as to deform the bonding wires. A flowable dielectric material such as curable liquid encapsulant, may be introduced between the first and second elements and around the bonding wires during or after the moving step. The flowable material may be cured such as by using heat or light so as to form an encapsulant layer between the first and second microelectronic elements and around at least a portion of the bonding wires. In certain preferred embodiments, the step of introducing a flowable material may include introducing the flowable material under pressure between the first and second elements. The flowable material may be introduced during the moving step so that the first and second elements move away from one another at least partially under the influence of the pressure of the flowable material. The cured flowable material preferably provides a compliant encapsulant layer that enables the first and second microelectronic elements and electrically conductive parts to move during thermal cycling.

The dielectric support preferably has one or more apertures or bond windows therein, the apertures being positioned in substantial alignment with the contacts of the second element during the juxtaposing step. The wire bonding step is desirably preformed so that the bonding wires extend or are extendable through the one or more apertures. Prior to introducing the flowable dielectric material, the one or more apertures may be sealed, such as by using one or more cover layers. In certain preferred embodiments, the step of sealing the one or more apertures may include applying a sealing sheet on the top surface of the dielectric support so as to close the apertures. The second element may be a semiconductor wafer including a plurality of semiconductor chips.

The second element may also include a plurality of semiconductor chips attached to a supporting substrate, whereby the supporting substrate may be severed for separating the semiconductor chips from one another after the wire bonding step. The method may also include severing the first microelectronic element and separating the chips from one another to form a plurality of individual packages, whereby each package includes at least one of the chips and a portion of the first microelectronic element.

The wire bonding step may be performed so that prior to the moving step, the bonding wires includes looped portions projecting upwardly from the top surface of the dielectric support, whereby the step of applying a sealing sheet may include forming the sealing sheet so that portions of the sealing sheet remote from the looped portions of the bonding wires lie against the top surface of the dielectric support whereas other portions of the sealing sheet extend over the looped portions of the bonding wires. The step of wire bonding may be performed so that prior to the moving step, the bonding wires project in a plane substantially parallel to the top surface from the bonding terminal to the apertures, the bonding wires being curved in horizontal directions. The step of sealing the apertures may also include engaging a mold plate with the top surface of the dielectric sheet.

In still other embodiments, the step of wire bonding may be performed so that prior to the moving step, the bonding wires include looped portions projecting upwardly from the top surface of the dielectric support, whereby the mold plate has an abutment surface for engaging the top surface of the dielectric sheet and upwardly-extending recesses extending in the mold plate from the abutment surface, the looped portions being received in the recesses. When the curable dielectric material is introduced into the mold, portions of the flowable material may penetrate into the recesses so as to form projections extending from the top surface of the dielectric sheet after the curing step.

In other preferred embodiments of the present invention, a method of making a microelectronic assembly includes juxtaposing a first element with a second element so that the first element is disposed above the second element, and providing leads extending between the elements, the leads being curved in a vertical direction and including looped portions projecting upwardly from the dielectric sheet. The method may also include moving the first and second elements through a pre-selected displacement relative to one another so as to deform the leads, wherein the looped portions are pulled toward the dielectric sheet during the moving step. The dielectric sheet preferably includes at least one aperture, wherein prior to the moving step, the loops project upwardly from the top surface and downwardly into the at least one aperture so that portions of the leads extending into the apertures connect with the second element, the loops being pulled downwardly into the aperture during the moving step. The moving step may include moving the elements with a vertical component of motion relative to one another.

In accordance with still other preferred embodiments of the present invention, a method of making a microelectronic assembly includes juxtaposing a connection component having leads with a microelectronic element having contacts thereon, and electrically interconnecting the leads and the contacts using conductive wires having first ends attached to the leads and second ends connected to the contacts. After the electrically interconnecting step, the connection component and the microelectronic element may be moved relative to one another so as to deform the conductive wires. The moving step desirably includes securing a first platen to the connection component and a second platen to the microelectronic element and moving the platens through a pre-selected displacement. The connection component may have a top surface, a bottom surface and at least one aperture or bond window extending between the top and bottom surfaces, whereby the leads includes frangible ends extending into the bond window.

In certain preferred embodiments, the electrically interconnecting step may include bonding the second ends of the conductive wires to the frangible ends of the leads and bonding the frangible ends of the leads to the contacts of the microelectronic element. The steps of bonding the second ends of the conductive wires to the frangible ends of the leads and the frangible ends of the leads to the contacts may be conducted simultaneously or at different times. During the moving step, the frangible ends of the leads may be detached from main body portions of the leads. When the second ends of the conductive wires are attached to the frangible ends of the leads, a support may be provided under the frangible ends of the leads.

In certain preferred embodiments, the connection component may include electrically conductive pads that are provided in substantial alignment with the leads extending over the connection component. In these embodiments, the second ends of the wire bonds may be initially attached to the conductive pads. The conductive wires may then be broken adjacent the second ends thereof so that the conductive wires may be bonded to the contacts of the microelectronic element. A curable liquid material may then be introduced between the connection component and the microelectronic element.

In other preferred embodiments of the present invention, a method of making a microelectronic assembly may include providing a first microelectronic element having a top surface with leads having fixed ends and releasable ends, the top surface of the microelectronic element having contacts. The method may also include juxtaposing a second microelectronic element having contacts on a contact bearing face and a rear surface with the first microelectronic element so that the contact bearing face of the second microelectronic element confronts the top surface of the first microelectronic element. A third microelectronic element having a contact bearing face and a rear surface may be juxtaposed with the second microelectronic element so that the rear surfaces of the respective second and third microelectronic elements confront one another, whereby contacts of the third microelectronic element face away from the first microelectronic element. The rear surfaces of the second and third microelectronic elements may be attached together using an adhesive, such as a thermally conductive adhesive. The contacts of the third microelectronic element may be wire bonded with the contacts of the connection component, and the second and third microelectronic elements may be moved away from the first microelectronic element so as to deform the bonding wires. The assembly may be encapsulated using a curable liquid material, such as a curable elastomer or polymer. The curable liquid material may be cured to provide a compliant layer.

In yet further preferred embodiments of the present invention, a packaged microelectronic element includes a microelectronic element having contacts on a contact bearing surface, and a dielectric sheet having connection terminals exposed at a top surface thereof, the sheet being disposed above the microelectronic element with the top surface facing away from the microelectronic element. The packaged microelectonic element desirably includes leads connecting the connection terminals to the contacts of the microelectronic element. An encapsulant layer may be provided between the dielectric sheet and the front surface of the microelectronic element, whereby the encapsulant layer includes projections formed integrally therewith and extending upwardly beyond the top surface of the dielectric layer. The packaged microelectronic element may also include masses of an electrically conductive bonding material engaged with the connection terminals and projecting upwardly from the top surface of the dielectric sheet beyond the projections. The leads may extend within the projections formed integrally with the encapsulant layer. The leads are preferably curved in vertical directions and include loops projecting upwardly from the top surface of the dielectric sheet within the projections.

These and other preferred embodiments of the present invention will be described in more detail below.

DETAILED DESCRIPTION OF PREFERRED EMBODIMENTS

Figure 1A:
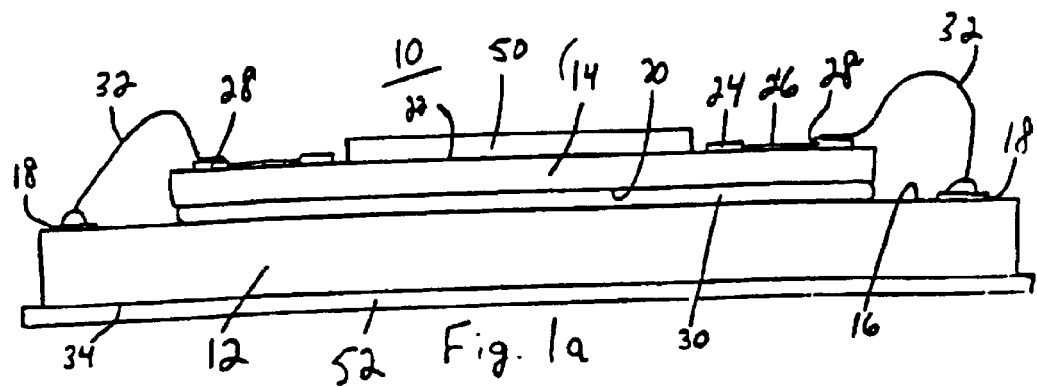
FIGS. 1a–1b show a method of making a microelectronic package including an expandable element, in accordance with one preferred embodiment of the present invention.

One embodiment of the present invention provides a method of making a semiconductor chip package 10 having an expandable structure. As shown in FIG 1a, a semiconductor chip 12 and a connection component 14 having electrically conductive parts are juxtaposed with one another before being bonded together to form a semiconductor chip package 10. The semiconductor chip 12 has a generally planer front face 16 including electrical parts or contacts 18 formed on peripheral regions of the front face 16. Other types of semiconductor chips may also be used, such as chips having contacts disposed in an "area array", i.e., an array covering substantially the entire front face of the chip with the contacts being uniformly spaced within the array. In the particular chip shown, the contacts 18 are arranged in rows (not shown) running substantially parallel to each edge of the chip 12. The contacts 18 in each row are spaced at very close intervals, typically about 65 to about 250 micrometers center-to-center. This center-to-center spacing is adequate for high input/output ("I/O") count chips used with wire bonding or tape automated bonding systems. The connection component 14 is preferably a flexible sheet, such as a flexible dielectric sheet comprising polymeric material, and has a first or bottom surface 20, a second or top surface 22 and edges bounding the first surface 20 and the second surface 22; however, in other preferred embodiments the connection component 14 is desirably substantially rigid. The connection component 14 also has a plurality of central terminals 24 distributed over the second surface 22. The terminals 24 are disposed at substantially even spaces on the second surface 22 so that the terminals 24 constitute an "area array." The number of central terminals 24 may be approximately equal to the number of peripheral contacts 18 on the semiconductor chip 12. Nonetheless, the center-to-center linear distance between adjacent ones of the central terminals 24 is substantially greater than the center-to-center distance between adjacent peripheral contacts 18 on the chip 12, because the central terminals 24 are substantially evenly distributed rather than concentrated in only a few rows. Each central terminal 24 is connected with a partial lead 26 and a bonding terminal 28, both of which are formed integrally with the central terminal 24. The bonding terminals 28 are arranged in rows adjacent the edges of the connection component 14. The central terminals 24, partial leads 26 and bonding terminals 28 may be formed from substantially any electrically conductive material, but preferably are formed from metallic materials such as copper and copper alloys, noble metals and noble metal alloys. The central terminals 24 provide for attachment of the semiconductor chip package 10 to a printed circuit board ("PCB"), typically by means of conventional solder balls or non collapsing (solid core) solder balls. The central terminals 24, partial leads 26 and bonding terminals are typically fabricated by conventional photolithographic, etching or deposition techniques.

Figure 1B:
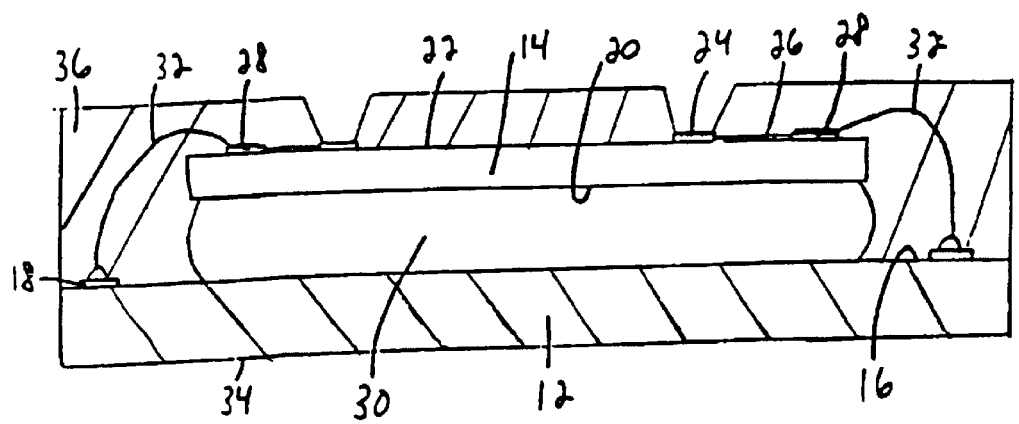

Referring to FIGS. 1a and 1b, in the assembly method according to preferred embodiments of the invention, the connection component 14 is juxtaposed with the front face 16 of the chip 12 and an expandable structure 30 is disposed therebetween. In certain embodiments, the expandable structure 30 will first be attached to the first surface 20 of the connection component 14 and the expandable structure/connection component subassembly will then be aligned with and assembled to a central portion of the front face 16 of the semiconductor chip 12 so that the expandable structure 30 does not cover the contacts 18 on the chip 12. The expandable structure 30 may comprise any number of materials which can be attached or uniformly applied to the connection component 14 and which can expand to occupy several times its original volume. For example, one such expandable structure 30 comprises a thermoplastic film loaded with a foaming agent; however, it is also contemplated that other expandable materials such as urethanes, olefinic thermoplastic elastomers and other elastomeric alloys. Prior to the aforementioned expansion of the expandable structure 30, a conventional wire bonding machine is employed to bond the electrically conductive wires 32 between each chip contact 18 and a respective bonding terminal 28 on the second surface 22 of the connection component 14. Utilization of the wire bonding machine preferably leaves sufficient slack in the wires 32 so that after expansion of the expandable structure 30 the wires 32 are not broken or stretched.

In the particular embodiments shown in FIG. 1a, the conductive wires 32 are connected to the contacts 18 on the semiconductor chip 12 using a ball bond and the other ends of the conductive wires 32 are connected to the bonding terminals 28 using a wedge bond; however, other configurations can be used, e.g., wedge bonds at both ends of the conductive wire 32. The wire bonding step precedes the step of expanding the expandable structure 30 so that the bonding terminals 28 are stationary and/or stable when the ends of the electrically conductive wires 32 are bonded thereto. The term "stable" means that the connection component and the expandable structure will absorb a minimal amount of the energy (e.g. ultrasonic energy) needed to insure a good bonding operation. Thus, in certain preferred embodiments, the bonding terminals 28 will remain essentially in one position during the bonding operation and will not move in either the vertical or the horizontal direction because, before the expanding step, the expandable structure 30 is substantially rigid. For example, if the bonding terminals 28 moved in the vertical direction during the bonding operation, then the positioning of the bonding wires 32 on the bonding terminals 28 would not be consistent and this may impede the formation of strong, reliable bonds.

After the wire bonding step, the expandable structure 30, including the thermoplastic film and foaming agent, is exposed to sufficient heat so that the thermoplastic film will soften and the foaming agent will vaporize, thereby causing the thermoplastic film to foam and expand. Expansion of the expandable structure 30 causes the connection component 14 to move away from the chip 12, as shown in FIG. 1b. Preferably, the expandable structure 30 will be compliant or resilient after the expanding step. As shown in FIGS. 1a and 1b, the wires 32 interconnecting the chip 12 to the connection component 14 are provided with an expanding zone comprising excess slack to insure that the wires can flex and bend during the expanding step and so that the wires 32 are not stretched or pulled taut. In order to insure that semiconductor chip 12 and the connection component 14 are parallel to one another after the expanding step, platens may be abutted against external surface regions of the semiconductor chip 12 and the connection component 14. In one embodiment, a first platen 52 is abutted against the rear face 34 of the semiconductor chip 12 and a second platen 50 is abutted against a central region of the second surface 22 of the connection component 14. The perimeter of the second platen 50 is preferably bounded by the bonding terminals 28 so that the conductive wires 32 are not damaged. After the first and second platens 52, 50 are in place, heat is applied to the expandable structure 30 and the expandable structure 30 is expanded in a controlled manner so that the connection component 14 moves away from the semiconductor chip 12 and so that the connection component 14 and the chip 12 are substantially parallel to one another. In addition, the overall thickness of the expandable structure 30 may be controlled through use of the first and second platens 50, 52. For example, the platens may be pressed against the chip 12 and the connection component 14 to restrict expansion of the expandable structure during the expanding step.

In the next stage of the process, a dielectric encapsulant is allowed to flow between the connection component 14 and the semiconductor chip 12 and around the expandable structure 30 and the conductive wires 32. Preferred dielectric encapsulants may include a liquid silicone rubber or other curable liquid elastomer. The encapsulant 36 is cured using energy such as heat, ultraviolet light or other radiant energy to form a substantially uniform, planer, compliant layer between the semiconductor chip 12 and the connection component 14. Because the encapsulant 36 is applied after the wire bonding operation, there is no risk of the encapsulant 36 coming in contact with the wires 32 or the electrically conductive parts of the chip 12 and the connection component 14 before the bonding step, which could diminish the strength of the bonds.

Figure 2A:
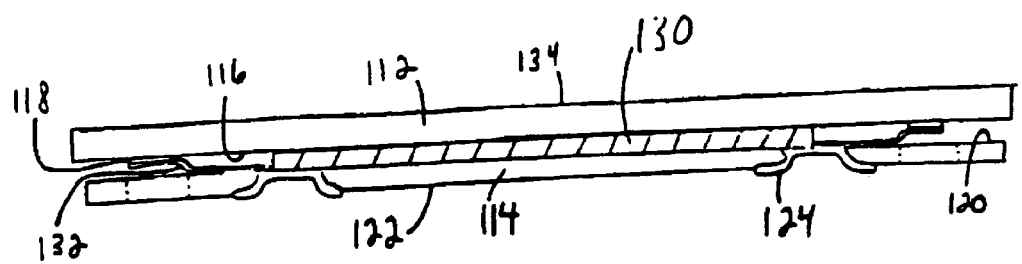
FIGS. 2a–2b show a method of making a microelectronic package including an expandable element, in accordance with another preferred embodiment of the present invention.
Figure 2B:
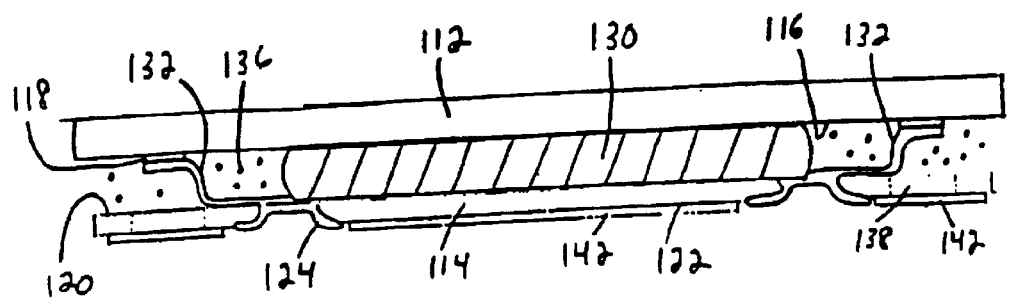

Referring to FIGS. 2a and 2b, in a method according to another embodiment of the invention, a tape automated bonding ("TAB") type lead or electroformed typed lead is used. In this embodiment, the connection component 114 comprises a sheet-like dielectric film, and has a first surface 120 and a second surface 122. The dielectric film is preferably formed from a polymeric material of an approximate thickness between 25 microns and 75 microns. The connection component 114 has conductive terminals 124 on its second surface 122, electrical parts or leads 132 extending from the terminals 124 for electrically connecting the terminals 124 to contacts 118 on a semiconductor chip 112, and bond windows for accessing the leads 132 while electrically connecting the leads 132 with the contacts 118. The leads 132 are typically lithographically defined on the dielectric film 114 to extend from the terminals 124. Thus, in this particular embodiment, the leads 132 are only bonded to the contacts 118 on the semiconductor chip 112 and are not bonded to the dielectric film 114.

After the expandable structure 130 has been assembled between the front face 116 of the semiconductor chip 112 and the first surface 120 of the dielectric film 114, each terminal 124 is connected with a contact 118 by bonding the leads 132 to the contacts 118. The terminals 124 and leads 132 may be formed from substantially any electrically conductive material 124, but preferably are formed from metallic materials such as copper and copper alloys, noble metals and noble metal alloys and are typically fabricated by conventional photolithographic and etching or deposition techniques. The leads 132 are electrically connected to the contacts 118 on the chip 112 by a conventional wire bonding operation, or by a bonding operation as shown in U.S. Pat. Nos. 5,398,863; 5,390,844; 5,536,909 and 5,491,302. Referring to FIG. 2b, after the electrically connecting step, the expandable structure 130 is subjected to heat so that the expandable structure expands as described above. During expansion, the leads 132 will bend and flex as the dielectric film 114 and the semiconductor chip 112 move away from one another; however, sufficient slack should remain in the leads 132 to account for thermal expansion differences between the semiconductor chip 112 and the dielectric film 114. First and second platens (not shown) may be abutted against the dielectric film 114 and the chip 112, respectively, to control expansion of the expandable structure 130 and to insure that the chip 112 and dielectric film 114 are substantially parallel to one another after the expanding step. In preferred embodiments, the dielectric film 114 is a flexible substrate. When the dielectric film is a flexible substrate, a first platen may be abutted against the second surface 122 of the dielectric film 114. The platen may incorporate a vacuum to help insure that the dielectric film 114 is maintained parallel to the chip 112 during expansion of the expandable structure 130. In other embodiments, the dielectric 114 film may be maintained planar and parallel to the chip 112 by stretching the dielectric film 114 across a frame or a ring structure (not shown) prior to any of the above steps.

Figure 3A:
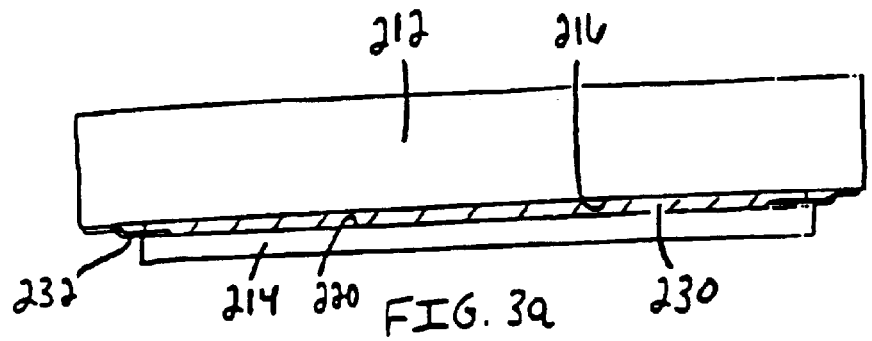
FIGS. 3a–3c show a method of making a microelectronic package including an expandable element, in accordance with further preferred embodiments of the present invention.
Figure 3B:
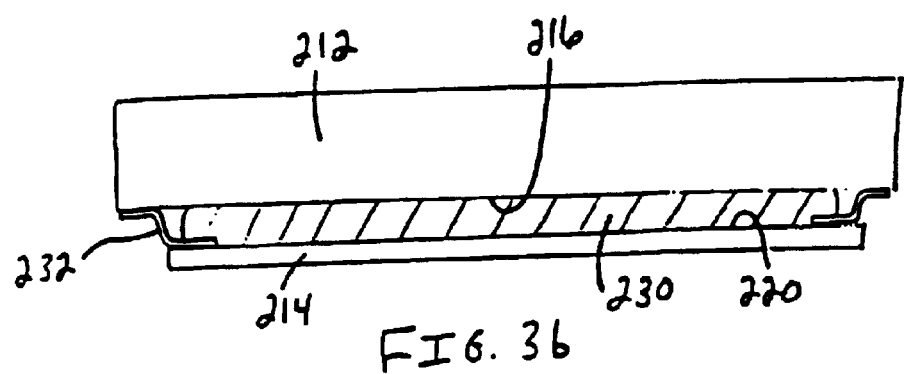
Figure 3C:
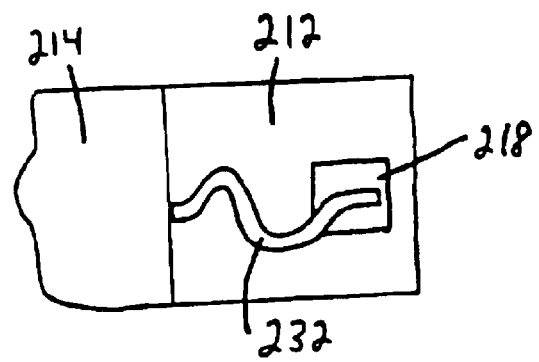

In the next stage of the process, a dielectric encapsulant 136 is allowed to flow between the dielectric film 114 and the chip 112 and around the expandable structure 130 and the leads 132 while the chip 112 and dielectric film are compressed together or held in place. Preferred dielectric encapsulants may comprise a liquid silicone rubber or other curable liquid elastomer. A mask or coverlay 142 may be placed over the bond windows 138 to prevent the encapsulant 136 from flowing through the bond windows 138 during the encapsulation process. The encapsulant 136 is then cured by energy such as heat, ultraviolet light or other radiant energy to form a substantially uniform, planer, compliant layer between the chip 112 and the dielectric sheet 114. Because the encapsulant 136 is applied after bonding, there is minimal risk of the encapsulant 136 coming in contact with the leads 132 or contacts 118 before bonding, which could diminish the strength of the bond FIGS. 3a and 3b show a similar structure to that disclosed in FIGS. 2a and 2b; however, the particular embodiment shown in FIGS. 3a and 3b comprise leads 232 which are connected to a first surface 220 of a dielectric film 214, i.e., the non-exposed surface of the dielectric film 214. In accordance with this embodiment, a semiconductor chip 212 and the dielectric film 214 are juxtaposed with one another and an expandable structure 230 is assembled between the front face 216 of the semiconductor chip 212 and the first surface 220 of the dielectric film 214. The leads 232 are then bonded to the contacts 218 on the front face 220 of the semiconductor chip 214 using a conventional bonding technique. In this embodiment, since there is insufficient room to provide vertical slack in the lead 232, lateral slack is provided therein. Referring to FIG. 3c, each lead 232 has an expansion section extending from an edge of the dielectric film 214. The expansion sections are each bonded to a contact 218 on the semiconductor chip 212. Each expansion section is laterally curved substantially parallel to the plane of the dielectric film 214 prior to the bonding operation. Preferably, the expansion sections laterally curve at least twice in opposite directions (substantially "S" shaped) and may be curved more than twice. The laterally curved leads 232 extending 4 between the terminals on the dielectric film 214 and the contacts 218 on the chip 212 create an expansion/contraction gap between the two microelectronic elements so that the expansion sections within the leads 232 may independently flex and bend during operational thermal cycling of the semiconductor chip package. The particular embodiment of leads 232 having lateral slack as shown in FIG. 3c is described in greater detail in commonly assigned U.S. Pat. No. 5,821,608, the disclosure of which is hereby incorporated by reference herein. The lateral slack in the lead 232 allows the lead 232 to expand in a somewhat spring-like manner as the expandable structure 230 is expanded. After the expanding step, an encapsulant 236 is allowed to flow between the dielectric film 214 and the semiconductor chip 212 and around the expandable structure 230 and the leads 232, in accordance with the processes described above.

Figure 4A:
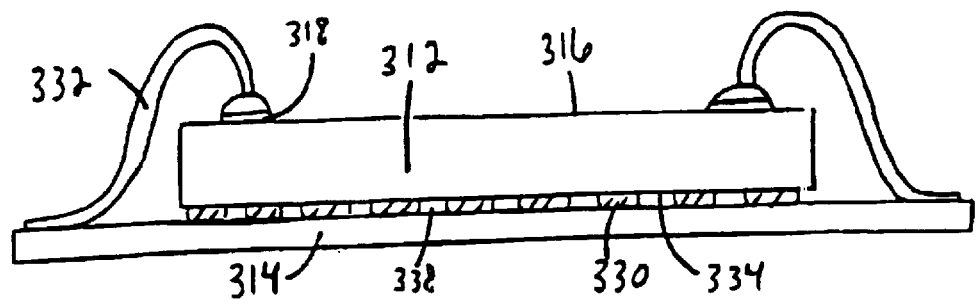
FIGS. 4a–4b show a method of making a microelectronic package, in accordance with still further preferred embodiments of the present invention.
Figure 4B:
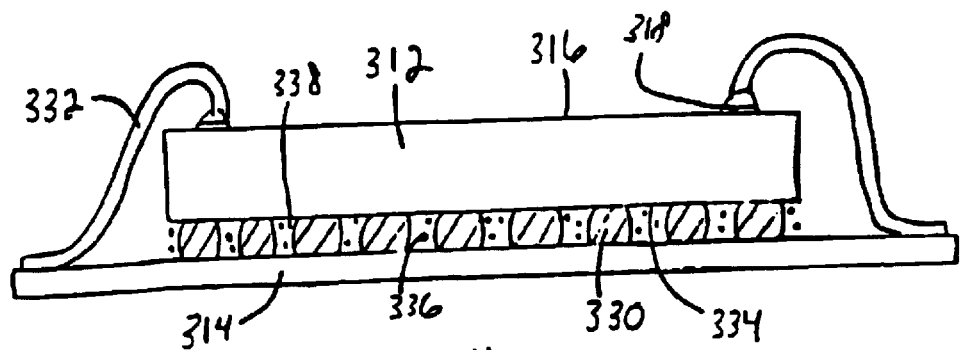

Referring to FIGS. 4a and 4b, in a method according to another embodiment of the invention, an expandable structure 330 is disposed between a substrate 314, such as a printed circuit board or a rigid connection component, and the rear face 334 of a semiconductor chip 312, i.e., the face of the semiconductor chip 312 opposite the front face 316 bearing contacts 318. In this embodiment, the expandable structure 330 comprises a plurality or array of pads (i.e., a matrix of dots), whereby any two adjacent pads 330 define a channel 338 therebetween. The channels 338 running between adjacent pads are preferably between 75 to 100 microns wide, so that an encapsulant 336, such as a curable silicone elastomer, may flow freely therethrough. The array of pads 330 shown in FIGS. 4a and 4b are described in greater detail in commonly assigned U.S. Pat. No. 5,659,952, the disclosure of which is hereby incorporated by reference herein. Preferably the array of pads 330 are spaced close enough together so that adequate support is provided for maintaining substantial parallelism between the chip 312 and the substrate 314. In addition, the pads 330 should be far enough apart so that the channels 338 are sufficiently wide after the pads 330 have been expanded for allowing the encapsulant 336 to flow within the channels 338. In certain embodiments, the pads 330 comprise a thermoplastic film and a foaming agent. Upon application of a sufficient amount of heat, the thermoplastic film will soften and the foaming agent will vaporize, causing the array of pads 330 to expand to the configuration shown in FIG. 4b. During the expansion step, the semiconductor chip 312 moves away from the substrate 314. However, the semiconductor chip 312 remains electrically interconnected to the substrate 314 because sufficient slack has been provided in the electrically conductive wires 332. After the expanding step, the pads 330 are preferably compliant or resilient for responding to thermal cycling differences between the semiconductor chip 312 and the substrate 314.

In other embodiments the expandable structure 330 may comprise a plurality of compliant pads connected by a web; a sheet having a plurality of compliant pads formed on opposite sides of the sheet; or a unitary structure having a square or rectangular shape. These various embodiments of the expandable structure 330 can be used in processes as described above, and in other processes for fabricating connection components or microelectronic packages. Further, the expandable structure according to the present invention may be stored and shipped with liner films applied to the surface regions thereof, as described in commonly assigned U.S. patent application Ser. No. 08/897,922, filed Jun. 20, 1997, the disclosure of which is hereby incorporated by reference herein.

In the next stage of the process, after expansion, a dielectric encapsulant is allowed to flow between the substrate 314 and the rear face 334 of the semiconductor chip 312 and within the channels 338. In one preferred embodiment, the encapsulant 336 is a curable silicone elastomer such as the silicone elastomer 6811 manufactured by Dow Corning. In other preferred embodiments, the encapsulant may comprise a compliant filler material, such as a liquid silicone rubber or other curable liquid elastomer. The encapsulant 336 material flows within the channels 338 running between the array of pads 330 while the semiconductor chip 312 and the substrate 314 are compressed together or held in place. The encapsulant 336 is preferably substantially similar to the expandable material which forms the expandable structure 330 in order to provide a compliant interface having a more homogenous structure, thereby minimizing problems associated with thermal cycling. Further, the semiconductor chip package assembly is preferably entirely encapsulated with the encapsulant (not shown) so that the semiconductor chip 312, electrically conductive wires 332 and substrate 314 are all covered by a second encapsulant. The first encapsulant and the second encapsulant may comprise the same material and may be deposited at the same time. After the encapsulant 336 has been allowed to flow within the channels 338 between the chip 312 and around the conductive wires 332, the encapsulant 336 is cured by using energy such as heat, ultraviolet light or other radiant energy to form a substantially uniform, planar compliant layer between the semiconductor chip 312 and the substrate 314.

Figure 5A:
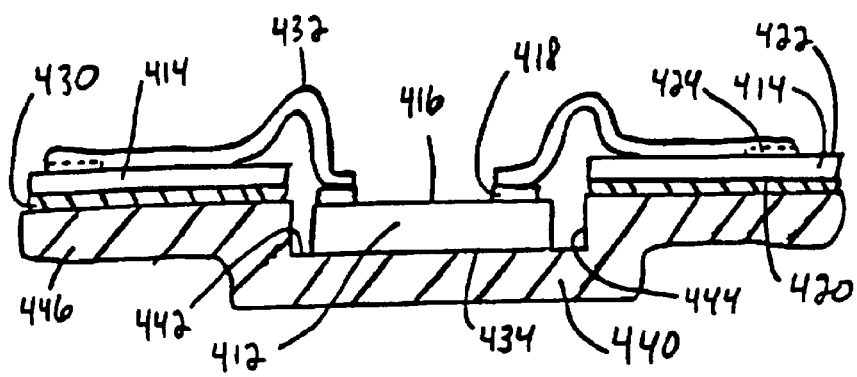
FIGS. 5a–5b show a method of making a microelectronic package including an expandable element, in accordance with yet further preferred embodiments of the present invention.
Figure 5B:
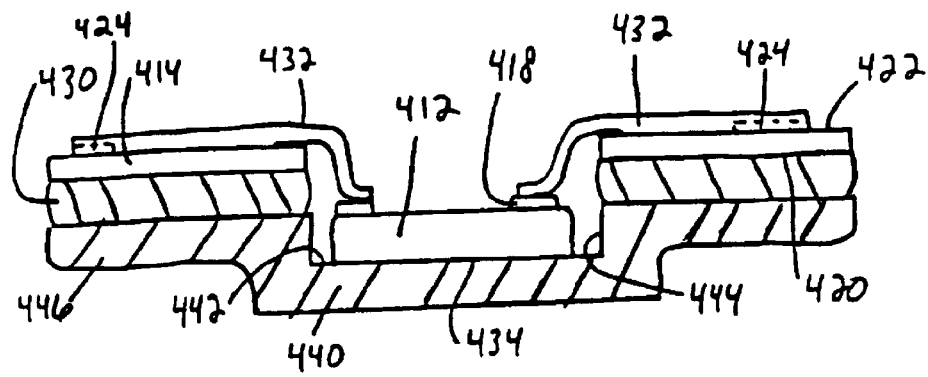

A still further embodiment of the present invention is shown in FIGS. 5a and 5b. This particular embodiment incorporates a fan-out semiconductor chip package whereby the leads 432 are connected to respective contacts 418 on a semiconductor chip 412 and extend outwardly beyond the periphery of the chip 412 to terminals on a substrate 414. A process in accordance with this particular embodiment of the present invention utilizes a semiconductor chip 412 having a front face 416 with contacts 418 thereon and having an oppositely facing rear surface 434. The particular chip illustrated in FIG. 5a has the contacts 418 disposed in an area array, i.e., an array covering substantially the entire front face 416 of the chip 412, with the contacts 418 being uniformly spaced within the array. The chip 412 is assembled in a package including a heat sink 440. The heat sink 440 is in the form of an open shell having a base wall 442, side walls 444 projecting upwardly from the base wall 442 around the periphery thereof, and a projecting region 446 extending outwardly from the side walls 444 and defining a generally planer surface remote from the base wall. The rear face 434 of the semiconductor chip 412 is bonded to the base wall 442 of the heat sink 440 by a thermally conductive adhesive layer. The adhesive layer may include any of the well known thermally conductive adhesive compositions, such as an epoxy loaded with metallic particles. The front face 416 of the chip 412 is substantially coplanar with the projecting regions 446 of the heat sink 440. Although gaps are shown between the edges of the chip 412 and the side walls 444 of the heat sink 440, it should be appreciated that the size of these gaps is exaggerated in the drawings for clarity of illustration. The projecting regions 446 of the heat sink 440 include a dielectric element 414 and an expandable structure 430 disposed between the dielectric element 414 and the projecting regions 446 of the heat sink 440. The dielectric element 414 includes a dielectric sheet incorporating one or more layers of a flexible, but substantially inextensible dielectric material. These flexible layers may include thin sheets of polyimide, typically having an aggregate thickness of about 25 microns (0.001 inch). The dielectric element 414 has a top surface 422, including electrically conductive terminals 424 which are distributed uniformly over the entire area of the top surface 422, and a bottom surface 420. The leads 432 are bonded to the chip contacts 418 in accordance with processes described above and the expandable structure 430 is then expanded in a controlled manner as described above. The final assembly may also be encapsulated using an encapsulant 436 as described above.

Figure 6A:
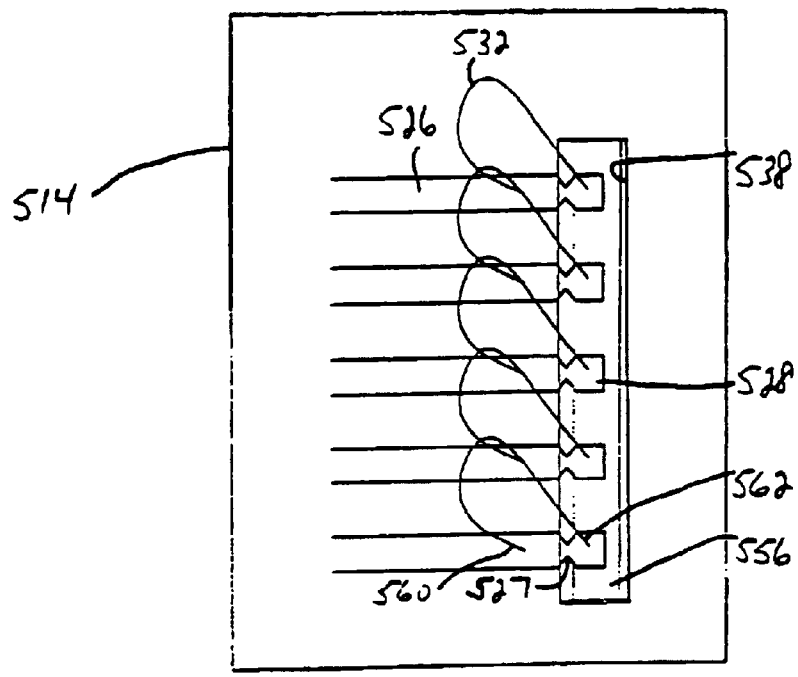
FIGS. 6a–6f show a method of making a microelectronic package, in accordance with other preferred embodiments of the present invention.
Figure 6B:
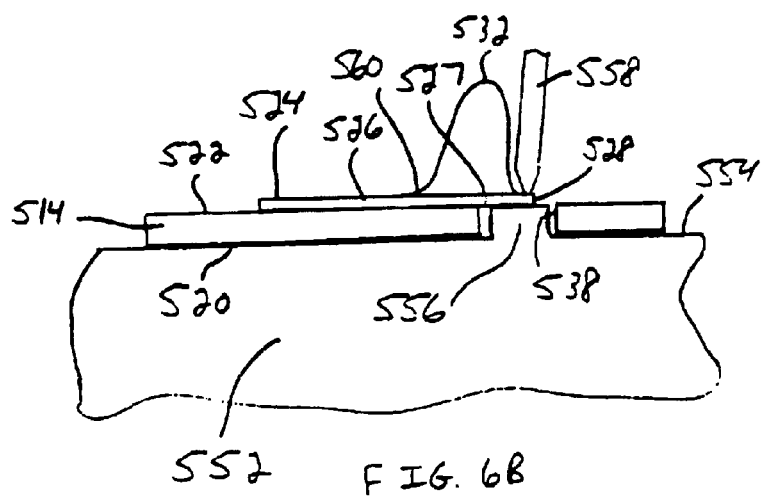

Referring to FIGS. 6a and 6b, in accordance with other preferred embodiments of the present invention, a connection component such as a flexible dielectric sheet 514 includes a bottom surface 520, a top surface 522 and one or more bond windows 538 extending between the bottom and top surfaces. The flexible dielectric sheet 514 includes a plurality of conductive leads 526 overlying the top surface 522 there. Each conductive lead 526 preferably includes a terminal end 524, a frangible end 528 remote therefrom, and v-shaped notches adjacent frangible end 528. As will be explained in more detail below, the v-shaped notches 527 facilitate detachment of the frangible end 528 of lead 526 from the lead 526.

Referring to FIG. 6b, in one preferred method dielectric sheet 514 is positioned atop a supporting substrate 552 having a top surface 554 and a support bar 556 projecting from the top surface thereof. The support bar 556 is preferably sized and shaped to fit within bond window 538. In certain preferred embodiments, the dielectric sheet 514 is positioned atop the first surface 554 of supporting substrate 552 so that the support bar 556 extends at least partially through bond window 538. Although the present invention is not limited by any particular theory of operation, it is believed that support bar 556 provides support for the frangible end 528 of lead 526 so that the frangible end 528 does not break apart from lead 526 when the end of a wire is bonded thereto. After the dielectric sheet 514 has been positioned atop supporting substrate 552, the frangible end 528 of lead 526 preferably overlies and is supported by support bar 556. A wire bonding tool 558 may then be used to dispensed conductive wires 532 having first ends 560 bonded to a main body portion of lead 526 and second ends 562 attached to the frangible ends 528 of the leads.

Figure 6C:
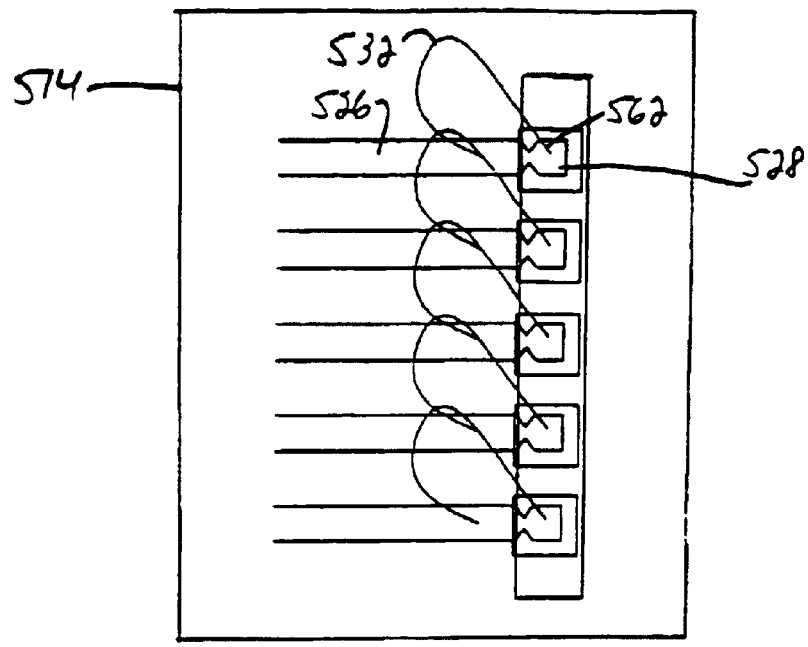
Figure 6D:
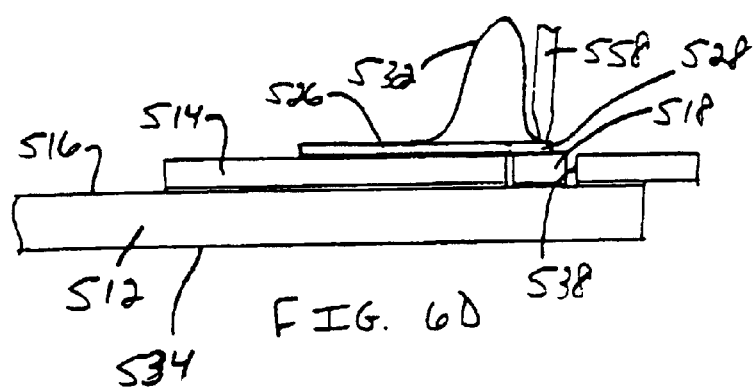

Referring to FIGS. 6c and 6d, after the second ends 562 of conductive wires 532 have been attached to frangible ends 528 of leads 526. The support bar (FIG. 6b) is removed and dielectric sheet 514 is juxtaposed with a microelectronic element such as a semiconductor chip 512. Semiconductor chip 512 preferably includes a contact bearing face 516, a rear surface 534 remote therefrom and one or more contacts 518 accessible at the contact bearing face. The dielectric sheet 514 is preferably positioned atop the contact bearing face 516 of semiconductor chip 512 so that chip contacts 518 are in substantial alignment with bond window 538. A bonding tool 558 may then be utilized to bond the second end 562 of conductive wire 532 to the frangible end 528 of lead 526, and for bonding the frangible end 528 of lead 526 to chip contact 518.

Figure 6E:
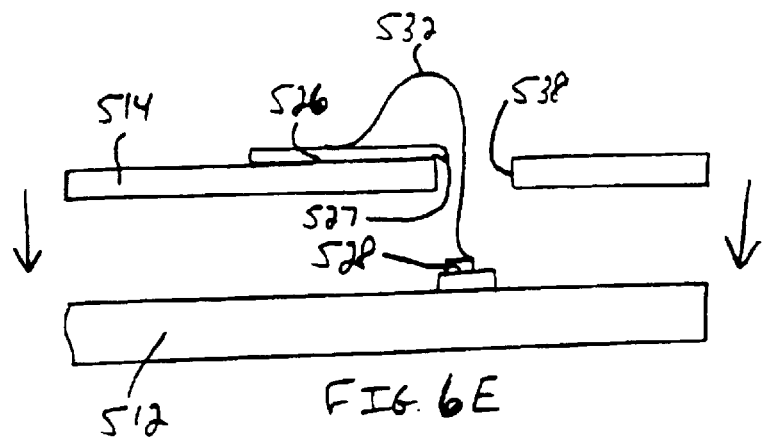

Referring to FIG. 6e, the dielectric sheet 514 and semiconductor chip 512 are then moved away from one another. In certain preferred embodiments, platens (not shown) may be temporarily attached to the connection component 514 and semiconductor chip 512 for controlling the movement of the dielectric sheet and semiconductor chip away from one another. As semiconductor chip 512 and dielectric sheet 514 move away from one another, the frangible ends 528 of leads 526 break away from the main body portion of leads 526 at v-shaped notches 527. As chip 512 moves away from dielectric sheet 514, conductive wire 532 is drawn through the bond window 538 of dielectric sheet 514, thereby removing at least some of the slack present in conductive wire 532. After the movement step it is preferred that at least some slack remains in conductive wire after the movements step so that the conductive wire may flex and bend during operation of the microelectronic assembly, as will be described in more detail below. As used herein, the term "slack" generally means that the conductive wire is not stretched taut or tight.

Figure 6F:
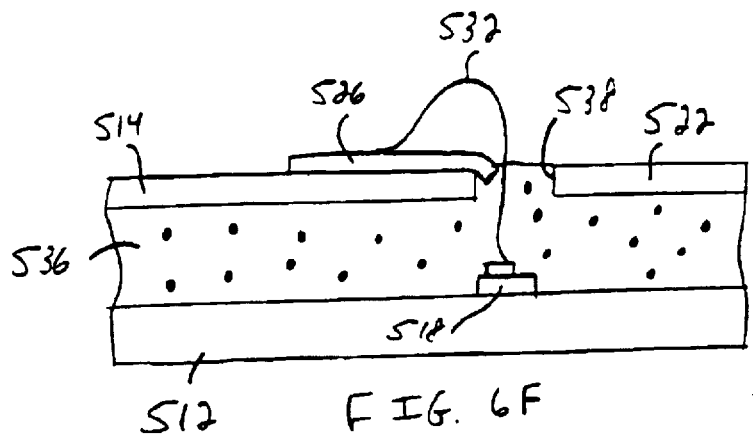

Referring to FIG. 6f, a curable liquid material 536 such as a curable liquid elastomer may be introduced between dielectric sheet 514 and semiconductor chip 512. The curable liquid material may be introduced either before, during or after the movement of dielectric sheet 514 and semiconductor chip 512 relative to one another. A coverlay (not shown) may be used to cover the bond windows 538 of dielectric sheet 514 so that the curable liquid material does not contact the top surface 522 of the dielectric sheet. The curable liquid material 536 may be cured such as by using heat, light or other energy so as to provide a compliant or resilient layer between dielectric sheet 514 and semiconductor chip 512. The complaint layer 536 allows the dielectric sheet 514 and semiconductor chip 512 to move relative to one another during operation of the microelectronic assembly. As mentioned above, conductive wire 532 retains sufficient slack so that the conductive wire may flex and bend during thermal cycling for maintaining reliable electrical interconnections between the leads 526 of dielectric sheet 514 and the chip contacts 518 of semiconductor chip 512.

Figure 7A:
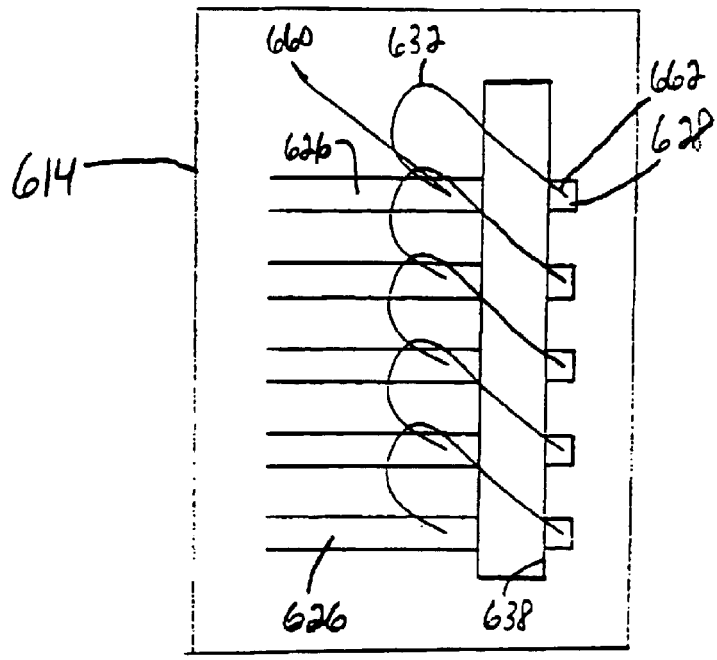
FIGS. 7a–7d show a method of making a microelectronic package including wire bonds, in accordance with other preferred embodiments of the present invention.

FIG. 7A–7D show a method of making a microelectronic assembly in accordance with other preferred embodiments of the present invention. Referring to FIG. 7A, a connection component such as dielectric sheet 614 includes a bottom surface 620, a top surface 622 and a plurality of conductive leads 626 formed over the top surface 622. Each conductive lead 626 preferably includes a terminal end 624 and at least one bond window 638 remote from the terminal end 624. Bond window 638 is desirably elongated and extends in a direction transverse to the longitudinal direction of conductive leads 626. Each dielectric sheet 614 also desirably includes a conductive pad 628 associated with one of the conductive leads 626. In the particular embodiment shown in FIG. 7A, each conductive pad 628 is in substantial alignment with one of the conductive leads 626.

Figures 1, 7A:
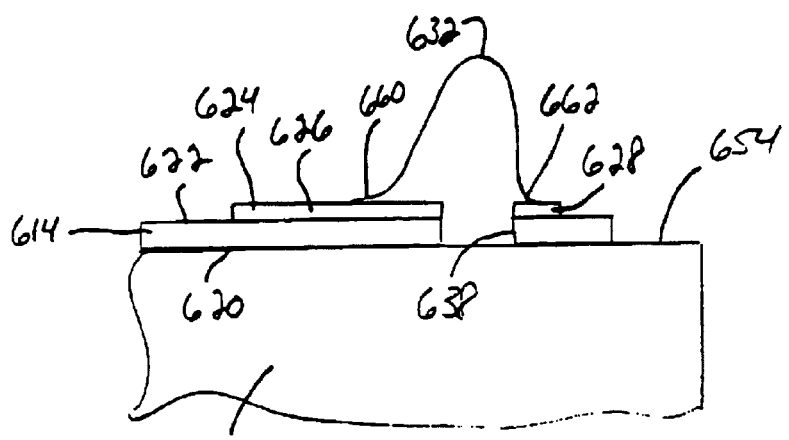
FIGS. 9a–9d-1 show a method of making a microelectronic assembly, in accordance with other preferred embodiments of the present invention.

Referring to FIG. 7A-1, in certain preferred embodiments, dielectric sheet 614 is placed atop a supporting substrate 652 so that the bottom surface 620 of dielectric sheet 614 abuts against a top surface 654 of the supporting substrate. A wire bonding tool (not shown) is then used to attach first ends 660 of conductive wires 632 to leads 626 and second ends 662 of the conductive wires to conductive pads 628.

Figure 7B:
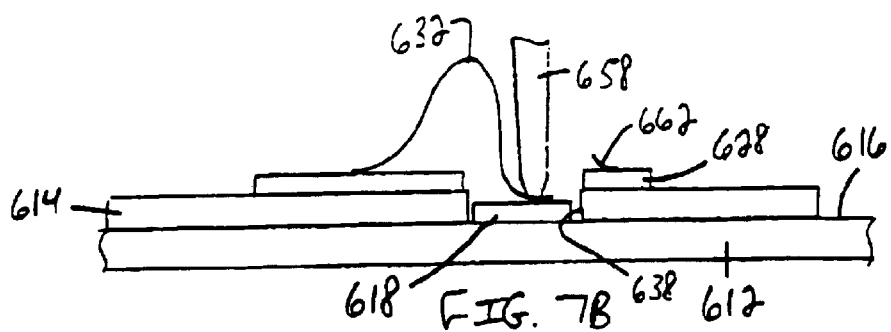
Figure 7C:
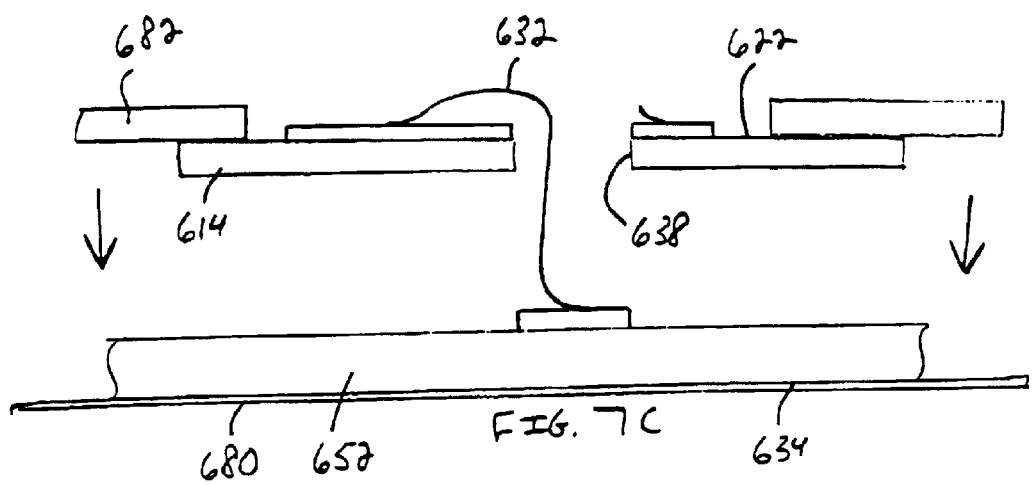

Referring to FIG. 7B, the dielectric sheet 614 is preferably positioned atop a semiconductor chip 612 having a contact bearing face 616 with one or more chip contacts 618. Dielectric sheet 614 is desirably positioned atop the contact bearing face 616 of chip 612 so that the bond window 638 of dielectric sheet 614 is in substantial alignment with the chip contact 618. A bonding tool 658 may then be utilized to break the conductive wire 632 adjacent the second end 662 attached to conductive pad 628. The bonding tool 658 effectively detaches the second end of the conductive wire 632 and bonds the second end to chip contact 618. A first platen 680 may be secured over the back surface 634 of semiconductor chip 652. A second platen 682 may be secured over the first surface 622 of dielectric sheet 614. As set forth in commonly assigned U.S. Pat. No. 5,518,964, the disclosure of which is hereby incorporated by reference herein, a vacuum may then be activated through the first and second platens 680, 682 so that the dielectric sheet 614 and semiconductor chip 652 may be moved away from one another in a controlled manner. As the dielectric sheet 614 and chip 652 are moved away from one another, the conductive wire 632 is drawn through bond window 638. As the conductive wire 632 is being drawn through bond window 638, the conductive wire bends and flexes so that at least some of the slack is removed from wire 632. However, the displacement of dielectric sheet 614 and semiconductor chip 652 is limited so that sufficient slack remains in the conductive wire 632 after the moving step.

Figure 7D:
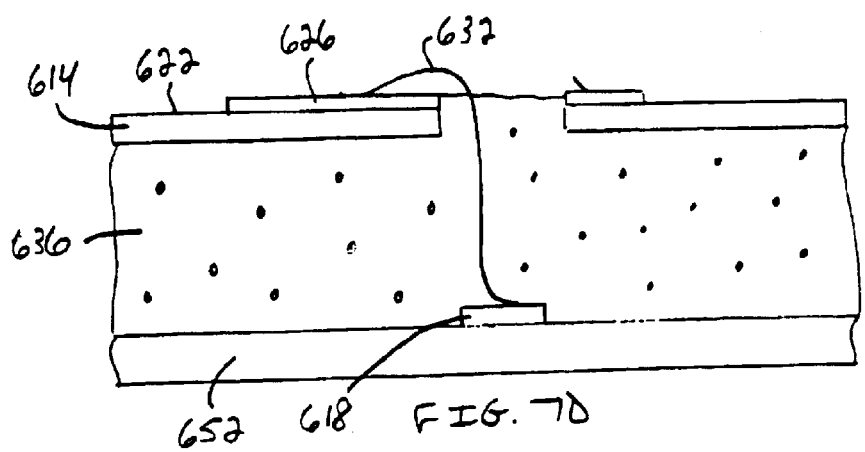

Referring to FIG. 7D, a curable liquid material 636, such as a curable liquid elastomer, may be introduced between the dielectric sheet 614 and the semiconductor chip 652. The curable liquid material 636 may be introduced either before, during or after the moving step. One or more cover layers (not shown) may be placed atop either the dielectric sheet or the semiconductor chip so as to prevent the curable liquid encapsulant engaging electrically conductive parts in embodiments where such engagement is undesirable. For example, a cover layer may be placed atop the first surface 622 of dielectric sheet 614 so as to prevent the curable liquid encapsulant from contacting selected portions of conductive lead 626. The curable liquid material is preferably cured to form a compliant layer 636 that allows dielectric sheet 614 and chip 652 to move relative to one another during thermal cycling. The compliant layer also enables conductive wire 632 to flex and bend during thermal cycling so as to maintain the electrical interconnection between lead 626 and chip contact 618.

Figure 8A:
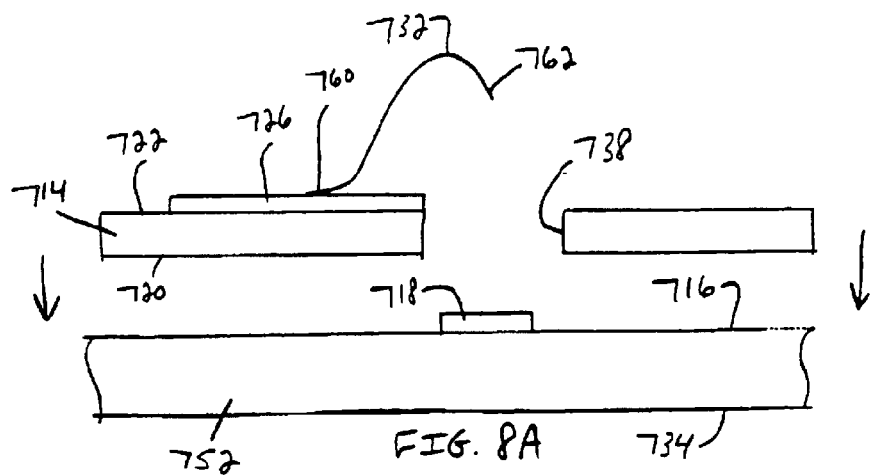
FIGS. 8a–8c show a method of making a microelectronic package including one or more wire bonds, in accordance with other preferred embodiments of the present invention.

In another preferred embodiment of the present invention, referring to FIG. 8A, dielectric sheet 714 has a bottom surface 720, a top surface 722, and one or more conductive leads 726 formed on top surface 722. Each conductive lead preferably extends toward a bond window 738. The bond window may be elongated. Each conductive lead 726 has a conductive wire 732 having a first end 760 bonded to conductive lead 726 and a second end 762 that extends over the top surface 722 of dielectric sheet 714. Dielectric sheet 714 is preferably juxtaposed with a microelectronic element such as semiconductor chip 752 having a contact bearing surface 716 with one or more chip contacts 718 and a back surface 734 remote therefrom.

Figure 8B:
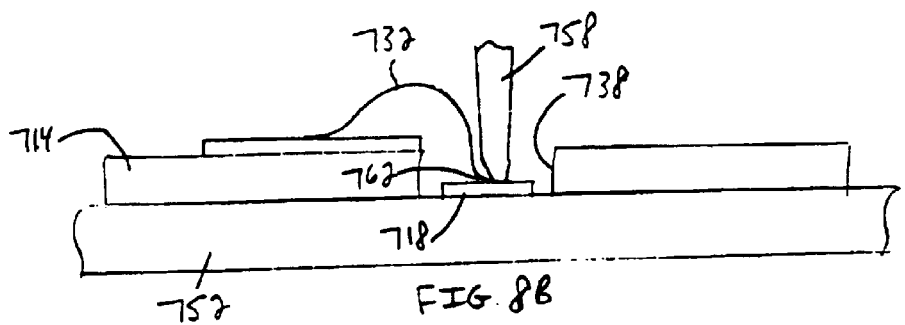

Referring to FIGS. 8A and 8B, the bond window 738 of dielectric sheet 714 is preferably aligned with the one or more chip contacts 718 so that the second ends 762 of conductive wires 732 overly the chip contacts 718. A wire bonding tool 758 is then utilized to bond the second ends 762 of conductive wires 732 to chip contacts 718.

Figure 8C:
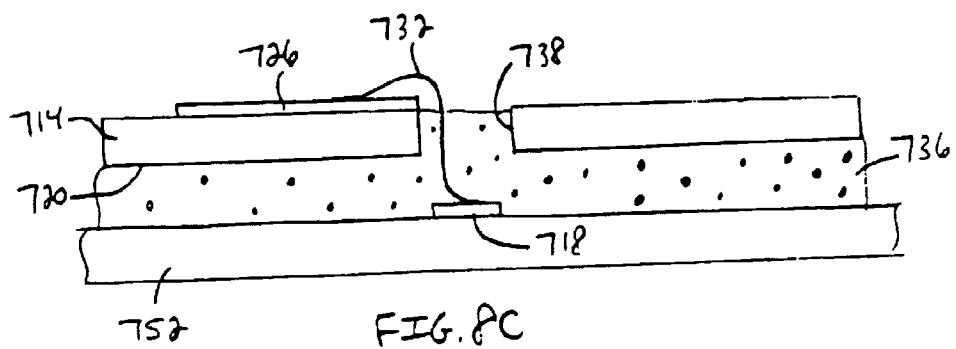

Referring to FIG. 8C, the dielectric sheet and semiconductor chip are preferably moved away from one another in a controlled manner so that at least one conductive wire 732 is drawn through bond window 738 of dielectric sheet. As chip 752 and dielectric sheet 714 move away from one another, at least some of the slack in conductive wire 732 is removed, whereby the conductive wire is bent in a downward direction toward the bottom surface 720 of dielectric sheet 714. A curable liquid material 736 may be introduced between the dielectric sheet 714 and semiconductor chip 752. As mentioned above, one or more cover layers may be applied over the exterior surfaces of the dielectric sheet 714 and/or semiconductor chip 752 so as to control the flow of the curable liquid material 736 when such material is in an uncured state. Energy, such as light or heat, may be applied to the curable liquid material 736 so as to provide a dielectric layer between dielectric sheet 714 and semiconductor chip 752 and around at least a portion of conductive wire 732. In preferred embodiments, the dielectric layer is a compliant layer that allows dielectric sheet 714 and semiconductor chip 752 to move relative to one another during thermal cycling. Compliant layer 736 also allows conductive wire 732 to flex and bend during operation of the microelectronic assembly so as to maintain a reliable electrical interconnection between conductive lead 726 and chip contact 718.

Figure 9A:
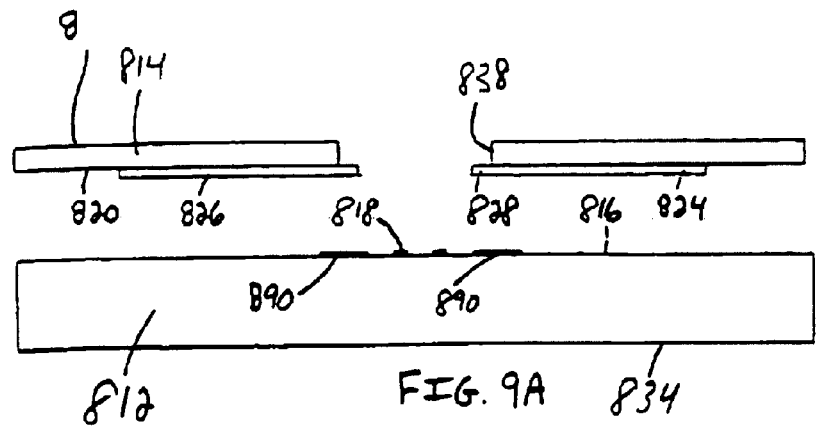

Referring to FIG. 9A, in further preferred embodiments, a flexible connection component such as dielectric sheet 814 includes a top surface 822 and a bottom surface 820 having a plurality of conductive leads 826 formed thereon. Each conductive lead 826 preferably includes a terminal end 824 that overlies the bottom surface 820 of dielectric sheet 814 and tip ends 828 that extend into bond window 838. The dielectric sheet 814 is preferably juxtaposed with a microelectronic element such as a semiconductor chip 812 having a contact bearing face 816 and a rear surface 834 remote therefrom. The contact bearing face 816 of microelectronic element 812 includes one or more insulating pads 890 attached to the contact bearing face 816. In the particular embodiment shown in FIG. 9A, the insulating pads 890 surround one or more contacts 818 accessible at the contact bearing face 816.

Figure 9B:
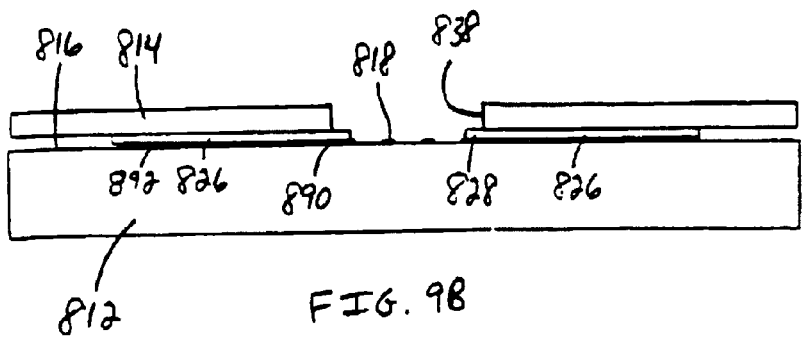

Referring to FIG. 9B, in one preferred assembly process the bond window 838 of dielectric sheet 814 is placed in substantial alignment with the chip contacts 818 and insulating pads 890 of chips 812, and tip ends 828 of conductive leads 826 are preferably abutted against insulating pads 890. In particularly preferred embodiments, the tip ends 828 of leads 826 engage the insulating pads while a gap 892 is formed between the remainder of lead 826 and contact bearing face 816 of microelectronic element 812. After the dielectric sheet 814 has been positioned atop the microelectronic element 812, the chip contacts 818 are preferably accessible through bond window 838.

Figure 9C:
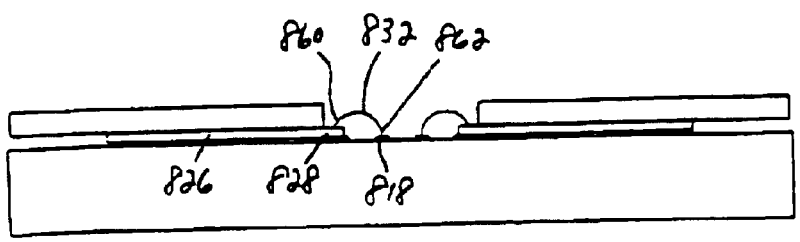

Referring to FIG. 9C, a wire bonding tool may be used to electrically interconnect the tip ends 828 of leads 826 and the chip contacts 818. Each bonded conductive wire 832 preferably has a first end 860 bonded to a tip end 828 of lead 826 and a second end 862 bonded to a chip contact 818.

Figure 9D:
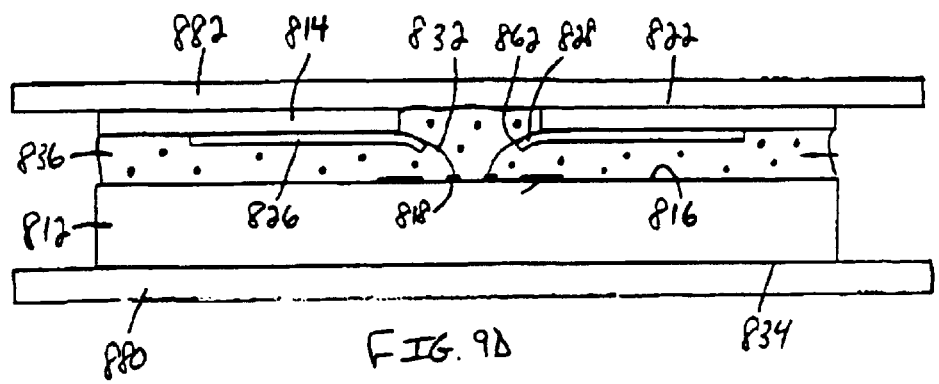
Figures 1, 9D:
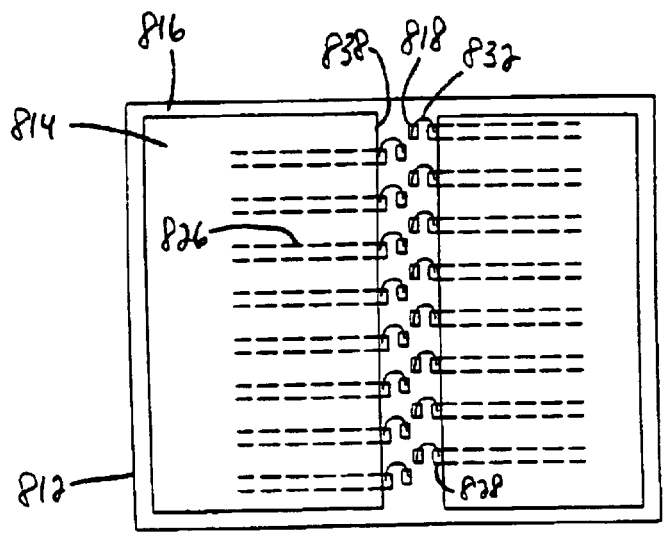

Referring to FIG. 9D, a first platen 880 may be positioned over the rear surface 834 of microelectronic element 812 and a second platen 882 may be provided over the top surface 822 of dielectric sheet 814. A vacuum may be activated through the first and second platens 880, 882 and the platens moved away from one another in a controlled manner so that dielectric sheet 814 and microelectronic element 812 move away from one another. As dielectric sheet 814 and microelectronic element 812 move away from one another, the conductive wires 632 bend into the extended orientation shown in FIG. 9D. Because the second ends 862 of the conductive wires are bonded to the tip ends 828 of leads 826, the tip ends 828 of leads 826 also flex slightly in a downward direction toward the contact bearing surface 816 of microelectronic element 812.

A curable liquid material 836 may be introduced between dielectric sheet 814 and microelectronic element 812. The curable liquid material may be introduced either before, during or after the moving step. The curable liquid material may then be cured, such as by using heat or light, so as to provide a compliant layer between dielectric sheet 814 and microelectronic element 812. As mentioned above, the compliant layer 836 allows the components to move relative to one another during thermal cycling of the microelectronic assembly. The compliant layer 836 also allows the conductive wires 832 and leads 826 to flex as necessary so as to maintain a reliable electrical interconnection between chip contacts 818 and leads 826.

FIG. 9D-1 shows a plan view of the assembly shown in FIG. 9D. The assembly includes dielectric sheet 814 overlying contact bearing face 816 of microelectronic element 812. The contact bearing face 816 includes a plurality of chip contacts 818 that are in substantial alignment with the bond window 838 of dielectric sheet 814. Dielectric sheet 814 includes a plurality of conductive leads 826 extending along an underside surface thereof. Each lead includes a tip end 828 that projects into bond window 838. After dielectric sheet 814 is placed atop microelectronic element 812, the tip ends 828 of conductive leads 826 are preferably in substantial alignment with the chip contacts 818. Conductive wires 832 electrically interconnect each chip contact 818 with one of the conductive leads 826.

In accordance with another preferred embodiment of the present invention, a microelectronic assembly includes a connection component 914 such as a dielectric sheet 914 having a first surface 922 and a second surface 920 remote therefrom. The dielectric sheet 914 preferably includes a plurality of flexible, conductive leads 926 having terminal ends 924 permanently attached to dielectric sheet 914 and tip ends 928 releasably attached to dielectric sheet 914. Releasable leads are disclosed in certain preferred embodiments of commonly assigned U.S. Pat. Nos. 5,763,941 and 5,904,498, and U.S. patent application Ser. Nos. 09/020,750 filed Feb. 9, 1998, Ser. No. 09/195,371 filed Nov. 18, 1998, Ser. No. 09/200,100 filed Nov. 25, 1998, and Ser. No. 09/471,973 filed Dec. 23, 1999, the disclosures of which are hereby incorporated by reference herein. The first surface 922 of dielectric sheet 914 also preferably includes one or more connection component contacts 970. The assembly also desirably includes a first microelectronic element 912 having a contact bearing face 916 with a plurality of contacts 918.

Figure 10A:
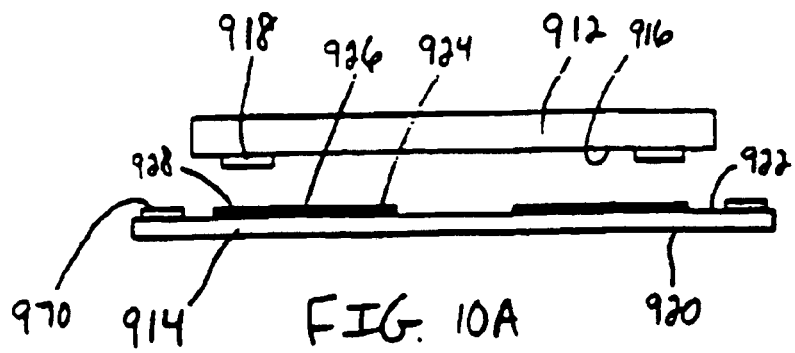
FIGS. 10a–10f show a method of making a microelectronic assembly including wire bonds, in accordance with other preferred embodiments of the present invention.
Figure 10B:
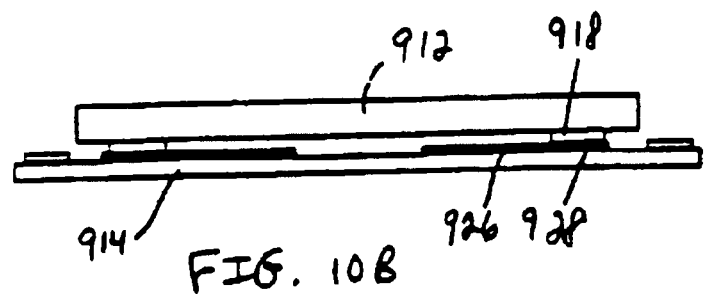

Referring to FIG. 10b, the first microelectronic element 912 is abutted against the dielectric sheet 914 so that the contacts 918 engage the tip ends 928 of leads 926. The tip ends 928 may be secured to the contacts 918 using bonding techniques such as diffusion bonding, thermosonic bonding and solder reflow bonding techniques. A conductive adhesive (not shown) may be provided between the contacts 918 and the tip ends 928 so as to adhere the contacts 918 to the tip ends 928.

Figure 10C:
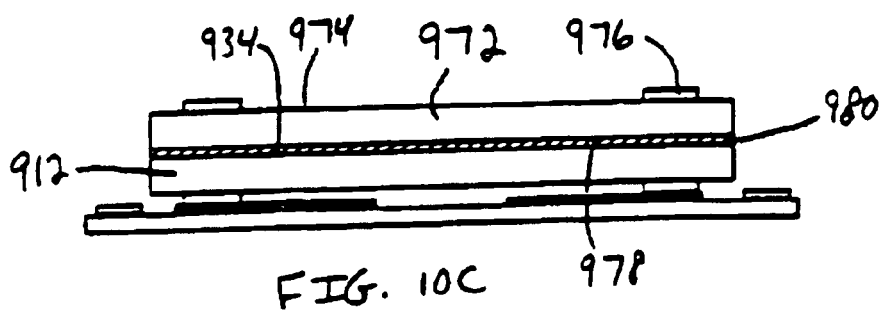

Referring to FIG. 10c, a second microelectronic element 972 having a contact bearing face 974 including contacts 976 and a rear surface 978 remote therefrom may be juxtaposed with the back surface 934 of the first microelectronic element 912. An adhesive 980, such as a thermally conductive adhesive, may be provided between the opposing rear surfaces 934, 978 of the first and second microelectronic elements 912, 972.

Figure 10D:
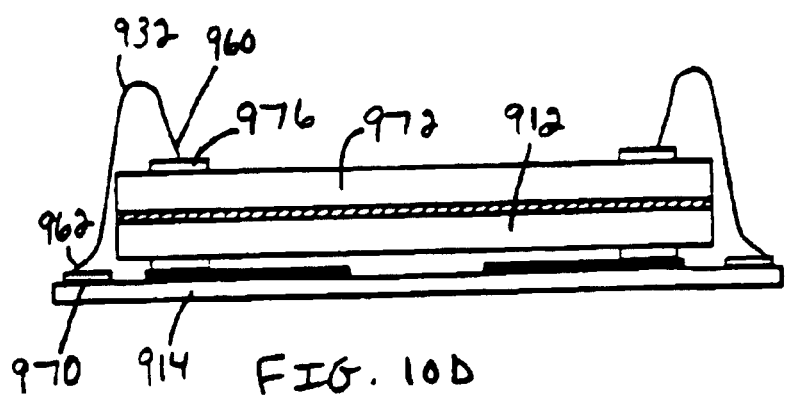

Referring to FIG. 10d, a wire bonding tool (not shown) may be utilized so as to electrically interconnect chip contacts 976 of the second microelectronic element 972 with the connection component contacts 970 of dielectric sheet 914. Each conductive wire 932 preferably has a first end 960 bonded to one of the chip contacts 976 of the second microelectronic element 972 and a second end 962 bonded to a dielectric sheet contact 970.

Figure 10E:
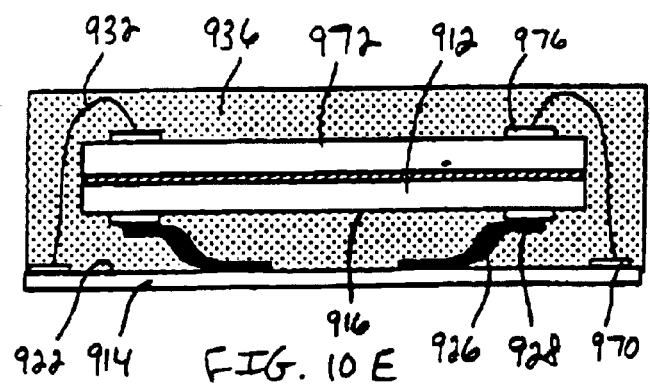

Referring to FIG. 10e, the first and second microelectronic elements 972, 912 are moved away from dielectric sheet 914 in a controlled manner. As the microelectronic elements 912, 972 and dielectric sheet 914 move away from one another, the tip ends 928 of flexible leads 926 are released from the top surface 922 of dielectric sheet 914. The conductive leads 926 are bent into the substantially s-shaped configuration shown in FIG. 10e, thereby enabling the leads to flex and bend during operation of the assembly. As the microelectronic elements 912, 972 move away from dielectric sheet 914, the conductive wires 932 also flex and bend to account for the increased distance between the contacts 976 of second microelectronic element 972 and the connection component contacts 970. After the movement step, the conductive wires 932 maintain a sufficient amount of slack so that the first and second microelectronic elements 912, 972 may move relative to the dielectric sheet 914 while maintaining a reliable electrical interconnection between contacts 976 and connection component contacts 970. A curable liquid material 936 may be provided between the top surface 922 of dielectric sheet 914 and the contact bearing face 916 of first microelectronic element 912. The encapsulant material 936 is also preferably provided around the first and second microelectronic elements 912, 972, the contacts 976 of the second microelectronic 972, and the conductive wires 932. The curable liquid material 936 is preferably cured such as by using heat or light so as to provide a compliant layer that enables the first and second microelectronic elements 912, 972 to move relative to the dielectric sheet 914 during thermal cycling of the microelectronic assembly. The compliant layer 936 also allows the conductive wires 932 and flexible leads 926 to flex and bend during thermal cycling while maintaining a reliable electrical interconnection between various components of the assembly.

Figure 10F:
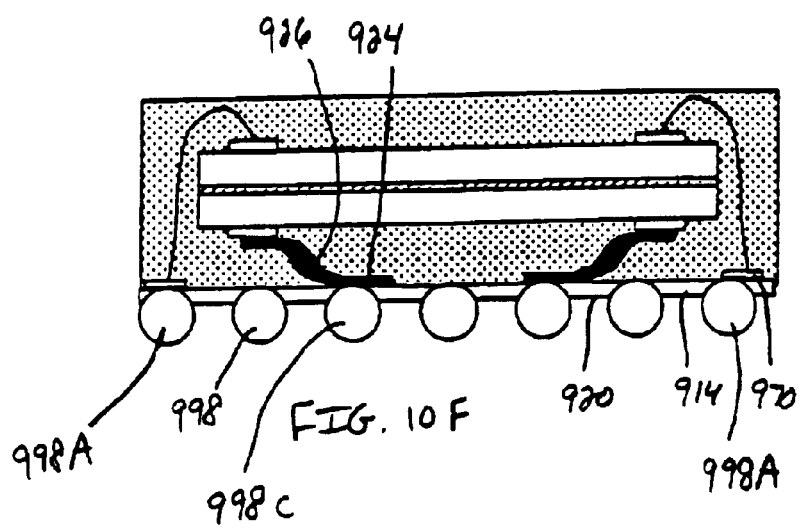

Referring to FIG. 10f, one or more conductive masses such as solder balls 998 may be attached to terminals (not shown) accessible at the bottom surface 920 of dielectric sheet 914. In certain preferred embodiments, vias may be formed in dielectric sheet 914 to provide access to the connection component contacts 970 so that the conductive masses 998 may be electrically interconnected with the dielectric sheet contacts 970 or leads 926. In the particular preferred embodiment shown in FIG. 10f, a first set of solder balls 998c are electrically interconnected with the terminal ends 924 of conductive leads 926, and a second set of solder balls 998a are electrically interconnected with the connection component contacts 970. After final assembly, the solder balls 998 may be connected to the contacts of an external element such as a printed circuit board or circuitized substrate. In other preferred embodiments, one or more of the terminal ends 924 of leads 926 may be electrically interconnected with one or more of the contacts 970 of the dielectric sheet 914 via an electrically conductive trace extending therebetween. As a result, a single solder ball 998C may electrically interconnect a contact of the first microelectronic element 912 with a contact of the second microelectronic element.

Figure 11A:
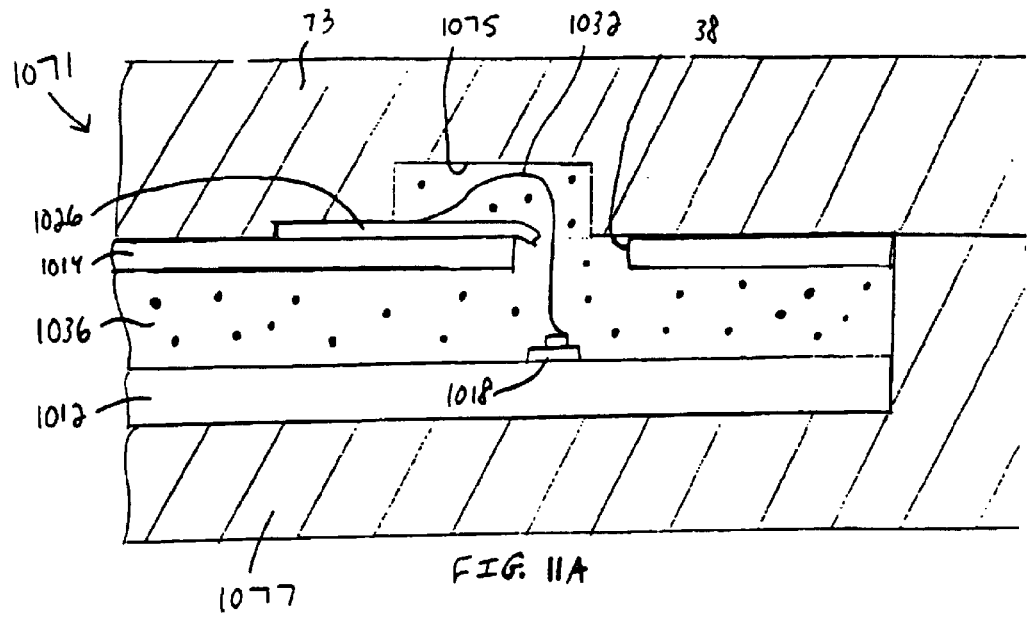
FIGS. 11a–11b show a method of making a microelectronic assembly, in accordance with other preferred embodiments of the present invention.
Figure 11B:
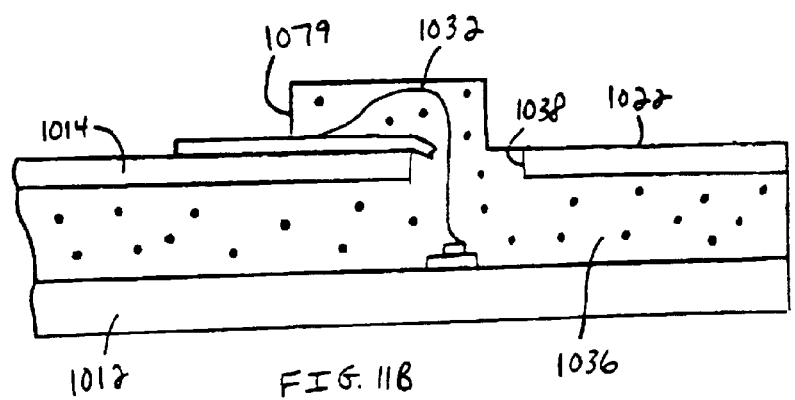

Referring to FIGS 11a and 11b, in certain preferred embodiments, a microelectronic assembly including conductive wires 1032 may be placed in a mold 1071 having an upper member 1073 with one or more recesses 1075 and a lower member 1077. After the microelectronic assemblies have been formed by electrically interconnecting lead 1026 with contacts 1018 using conductive wires 1032, the assembly is placed in mold 1071. As shown in FIG. 11a, the microelectronic element 1012 desirably sits within the lower mold member 1077 and the upper mold member 1073 is placed atop the lower mold member 1077. The recess 1075 of the upper mold member 1073 is preferably placed in alignment over a looped portion of the conductive wire 1032. As a curable liquid material 1036 is introduced into mold 1071, the curable liquid material passes between dielectric sheet 1014 and microelectronic element 1012. The curable liquid material 1036 also passes through the bond window 1038 of dielectric sheet 1014 and into the recess 1075 of upper mold member 1073. In the recess 1075 of upper mold member 1073, the curable liquid material encapsulates the portion of the conductive wire 1032 therein. The curable liquid material 1036 is preferably cured to provide a compliant layer that allows the dielectric sheet and microelectronic element to move relative to one another during operation of the microelectronic assembly.

Referring to FIG. 11b, after the dielectric material has been cured, the microelectronic assembly may be removed from the mold. The microelectronic assembly includes dielectric sheet 1014 electrically interconnected with microelectronic element 1012 by one or more conductive wires 1032. A projecting portion 1079 of the compliant layer 1036 projects above the top surface 1022 of dielectric sheet 1014. The projecting portion 1079 encapsulates the portion of the conductive wire 1032 projecting through bond window 1038 and above the top surface 1022 of dielectric sheet 1014.

These and other variations and combinations of the features discussed above can be utilized without departing from the present invention as defined by the claims. For example, in other embodiments the foaming agent for expanding the substrate may be a chemically reactive material. In addition, many microelectronic packages may be simultaneously manufactured using the processes described above. These packages are then separated from one another using a standard dicing technique and the individual microelectronic packages may be attached to a supporting substrate such as a standard printed circuit board. Accordingly, the foregoing description of the preferred embodiments should be taken by way of illustration rather than by way of limitation of the invention.

What is claimed is:

1. A method of making a microelectronic assembly comprising:
    (a) providing a connection component having a first surface including conductive leads and contacts, said conductive leads having terminal ends permanently secured to said connection component and tip ends releasably secured to said connection component;
    (b) juxtaposing a first microelectronic element having contacts with the first surface of said connection component and attaching the contacts of said first microelectronic element to the tip ends of said leads;
    (c) attaching a second microelectronic element having contacts to a back surface of said first microelectronic element, wherein the contacts of said second microelectronic element face away from the first surface of said connection component;
    (d) wire bonding the contacts on said connection component with the contacts of said second microelectronic element so that elongated bonding wires extend between the contacts of said connection component and the contacts of said second microelectronic element; and
    (e) after the wire bonding step, moving said first and second microelectronic elements through a preselected displacement relative to said connection component so as to deform the bonding wires and the leads.

2. The method as claimed in claim 1, wherein the moving step further comprises:
    releasing the tip ends of said leads from the top surface of said connection component; and bending said leads into a substantially s-shaped configuration.

3. The method as claimed in claim 1, wherein said bonding wires flex and bend during the moving step for maintaining an electrical connection between the contacts of said second microelectronic element and the contacts of said connection component.

4. The method as claimed in claim 1, further comprising introducing a curable liquid material between a top surface of said connection component and a contact bearing face of said first microelectronic element.

5. The method as claimed in claim 4, wherein said curable liquid material is introduced during the moving step so that said first and second microelectronic elements move away from said connection component at least partially under the influence of pressure of said curable liquid material.

6. The method as claimed in claim 4, wherein the introducing the curable liquid material step includes encapsulating said first and second microelectronic elements, the contacts of said second microelectronic element, and said conductive wires with said curable liquid material.

7. The method as claimed in claim 4, further comprising curing said curable liquid material so as to provide a compliant layer that enables said first and second microelectronic elements to move relative to said connection component during thermal cycling of said microelectronic assembly.

8. The method as claimed in claim 7, wherein said compliant layer enables said conductive wires and conductive leads to flex and bend during thermal cycling for maintaining reliable electrical interconnections within said microelectronic assembly.

9. The method as claimed in claim 1, wherein said connection component comprises a flexible dielectric sheet having the first surface and a second surface remote therefrom.

10. The method as claimed in claim 9, wherein said connection component includes one or more terminals accessible at the second surface thereof, said terminals being electrically interconnected with the permanently secured ends of said leads or to the contacts of said connection component.

11. The method as claimed in claim 10, further comprising attaching one or more conductive masses to the terminals of said connection component.

12. The method as claimed in claim 11, further comprising bonding said microelectronic assembly to a printed circuit board.

13. The method as claimed in claim 1, wherein said first microelectronic element includes one or more semiconductor chips.

14. The method as claimed in claim 1, wherein said second microelectronic element includes one or more semiconductor chips.

15. The method as claimed in claim 1, wherein said conductive wires have first ends bonded to one of the contacts of said second microelectronic element and second ends bonded to the contacts of said connection component.

16. The method as claimed in claim 1, wherein said first microelectronic element or said second microelectronic element includes a semiconductor wafer.

17. The method as claimed in claim 1, further comprising attaching rear surfaces of said first and second microelectronic elements to one another.

18. The method as claimed in claim 17, wherein the attaching step includes providing an adhesive between the rear surfaces of said first and second microelectronic elements.

19. The method as claimed in claim 17, wherein said adhesive is a thermally conductive adhesive.

20. The method as claimed in claim 1, further comprising electrically interconnecting one or more of said leads of said connection component with one or more of said contacts of said connection component.

21. A method of making a microelectronic assembly comprising:
   (a) providing a connection component having a first surface including conductive leads and contacts, said conductive leads having terminal ends permanently secured to said connection component and tip ends releasably secured to said connection component;
   (b) juxtaposing a first microelectronic element having contacts with the first surface of said connection component and attaching the contacts of said first microelectronic element to the tip ends of said leads;
   c) attaching a second microelectronic element having contacts to a back surface of said first microelectronic element, wherein the contacts of said second microelectronic element face away from the first surface of said connection component;
   d) wire bonding the contacts on said connection component with the contacts of said second microelectronic element so that elongated bonding wires extend between the contacts of said connection component and the contacts of said second microelectronic element;
   e) after the wire bonding step, moving said first and second microelectronic elements through a preselected displacement relative to said connection component so as to deform the bonding wires and the leads; and
   f) introducing a curable liquid material between at top surface of said connection component and a contact bearing face of said first microelectronic element, wherein said curable liquid material is introduced during or after the moving step.

22. A method of making a microelectronic assembly comprising:
   (a) providing a connection component having a first surface including conductive leads and contacts, said conductive leads having terminal ends permanently secured to said connection component and tip ends releasably secured to said connection component;
   (b) juxtaposing a first microelectronic element having contacts with the first surface of said connection component and attaching the contacts of said first microelectronic element to the tip ends of said leads;
   c) attaching a second microelectronic element having contacts to a back surface of said first microelectronic element, wherein the contacts of said second microelectronic element face away from the first surface of said connection component;
   (d) wire bonding the contacts on said connection component with the contacts of said second microelectronic element so that elongated bonding wires extend between the contacts of said connection component and the contacts of said second microelectronic element;
   e) after the wire bonding step, moving said first and second microelectronic elements through a preselected displacement relative to said connection component so as to deform the bonding wires and the leads; and
   (f) providing an expandable structure between said first microelectronic element and said connection component and expanding said expandable structure during the moving step.

* * * * *

UNITED STATES PATENT AND TRADEMARK OFFICE
CERTIFICATE OF CORRECTION

PATENT NO. : 6,848,173 B2  
DATED : February 1, 2005  
INVENTOR(S) : Joseph Fjelstad et al.

It is certified that error appears in the above-identified patent and that said Letters Patent is hereby corrected as shown below:

Column 21,
Line 1, "claim 17" should read -- claim 18 --.

Signed and Sealed this

Thirteenth Day of September, 2005

JON W. DUDAS
*Director of the United States Patent and Trademark Office*